(12) United States Patent
Yasunaga

(10) Patent No.: US 9,293,435 B2
(45) Date of Patent: Mar. 22, 2016

(54) SEMICONDUCTOR DEVICE AND PRODUCTION METHOD THEREFOR

(75) Inventor: Shoji Yasunaga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 445 days.

(21) Appl. No.: 13/395,653

(22) PCT Filed: Sep. 10, 2010

(86) PCT No.: PCT/JP2010/065652
§ 371 (c)(1),
(2), (4) Date: Mar. 12, 2012

(87) PCT Pub. No.: WO2011/030867
PCT Pub. Date: Mar. 17, 2011

(65) Prior Publication Data
US 2012/0168946 A1 Jul. 5, 2012

(30) Foreign Application Priority Data

Sep. 11, 2009 (JP) ................................. 2009-210776
Sep. 16, 2009 (JP) ................................. 2009-214925

(51) Int. Cl.
*H01L 23/498* (2006.01)
*H01L 23/48* (2006.01)
*H01L 21/50* (2006.01)
(Continued)

(52) U.S. Cl.
CPC ............ *H01L 24/32* (2013.01); *H01L 23/3107* (2013.01); *H01L 23/4952* (2013.01); *H01L 23/49503* (2013.01); *H01L 23/49513* (2013.01); *H01L 23/49541* (2013.01); *H01L 24/48* (2013.01); *H01L 24/45* (2013.01); *H01L 2224/27013* (2013.01); *H01L 2224/32057* (2013.01); *H01L 2224/32245* (2013.01); *H01L 2224/45015* (2013.01); *H01L 2224/45144* (2013.01); *H01L 2224/4809* (2013.01); *H01L 2224/48091* (2013.01); *H01L 2224/48247* (2013.01); *H01L 2224/48455* (2013.01); *H01L 2224/48465* (2013.01); *H01L 2224/48471* (2013.01); *H01L 2224/73265* (2013.01); *H01L 2224/78301* (2013.01); *H01L 2224/83192* (2013.01); *H01L 2224/83385* (2013.01);
(Continued)

(58) Field of Classification Search
CPC ............ H01L 23/495; H01L 23/49503; H01L 23/49513; H01L 23/49517; H01L 23/4952; H01L 23/49575; H01L 23/48; H01L 23/52
USPC .................................................... 257/666, 676
See application file for complete search history.

(56) References Cited

U.S. PATENT DOCUMENTS 4,415,115 A * 11/1983 James ............................ 228/170
5,395,035 A * 3/1995 Nakao ............................ 228/4.5
(Continued)

FOREIGN PATENT DOCUMENTS

| JP | 07-106350 A | 4/1995 |
| JP | 2003-249616 A | 9/2003 |
| JP | 2004-207292 A | 7/2004 |
| JP | 2004-319830 A | 11/2004 |
| JP | 2008-041999 A | 2/2008 |

*Primary Examiner* — Peniel M Gumedzoe
(74) *Attorney, Agent, or Firm* — Rabin & Berdo, P.C.

(57) ABSTRACT

A semiconductor device includes a semiconductor chip, a lead arranged on a side portion of the semiconductor chip, and a wire, whose one end and another end are bonded to the semiconductor chip and the lead respectively, having a ball portion and a stitch portion wedged in side elevational view on the semiconductor chip and the lead respectively. An angle of approach of the wire to the lead is not less than 50°, and the length of the stitch portion is not less than 33 μm.

18 Claims, 23 Drawing Sheets

(51) Int. Cl.
*H01L 23/00* (2006.01)
*H01L 23/31* (2006.01)
*H01L 23/495* (2006.01)

(52) U.S. Cl.
CPC ............. *H01L2224/85186* (2013.01); *H01L 2224/92247* (2013.01); *H01L 2924/01004* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01)

(56) References Cited

U.S. PATENT DOCUMENTS

| | | | | |
|---|---|---|---|---|
| 5,421,503 | A | * | 6/1995 | Perlberg et al. ............... 228/4.5 |
| 5,844,306 | A | * | 12/1998 | Fujita et al. ................... 257/676 |
| 6,131,799 | A | * | 10/2000 | Egger et al. ................ 228/180.5 |
| 6,372,625 | B1 | * | 4/2002 | Shigeno et al. ............... 438/617 |
| 7,397,114 | B2 | * | 7/2008 | Miyaki et al. ................. 257/677 |
| 2008/0038872 | A1 | | 2/2008 | Kimura |
| 2008/0258280 | A1 | * | 10/2008 | Seo ............................... 257/676 |
| 2011/0057299 | A1 | * | 3/2011 | Takata et al. .................. 257/676 |

* cited by examiner

SEMICONDUCTOR DEVICE AND PRODUCTION METHOD THEREFOR

TECHNICAL FIELD

The present invention relates to a semiconductor device and a production method therefor.

BACKGROUND ART

A typical semiconductor device includes a die pad, a semiconductor chip arranged on the die pad, leads arranged on the periphery of the die pad, and wires connecting the semiconductor chip and the leads with one another.

When extending the wires, normal bonding of bonding (first bonding) the wires to the semiconductor chip in advance and subsequently bonding (second bonding) the same to the leads is performed in general. In a case where a difference in elevation between portions (pads) of the semiconductor chip to which the wires are connected and the leads is relatively large, however, it is difficult to excellently bond the wires to the leads, and hence the so-called reverse bonding is performed. In the reverse bonding, the wires are first-bonded to the leads, and second-bonded to the semiconductor chip.

FIG. 34 is a schematic side elevational view of a semiconductor device in which a wire is extended by reverse bonding.

The rear surface of a semiconductor chip 201 is bonded to the upper surface of a die pad 202 in a state upwardly directing the front surface which is an element forming surface. A pad 203 is arranged on a peripheral edge portion of the front surface of the semiconductor chip 201. A wire 205 is extended between the pad 203 and the upper surface of a lead 204 arranged on the periphery of the die pad 202.

In wire bonding, the lead 204 is pressed by a press plate 208, in order to fix the die pad 202 and the lead 204 to a wire bonder. The press plate 208 is brought into contact with a position at a small interval from a bonded position of the wire 205 (ball portion 206) on the upper surface of the lead 204 on a side opposite to the semiconductor chip 201. Then, an FAB (Free Air Ball) is formed on a forward end portion of the wire 205 held in a capillary C (shown by broken lines) of the wire bonder, and the FAB is bonded to the upper surface of the lead 204. Thereafter the capillary C is moved toward the pad 203, and the wire 205 is pressed against the pad 203, and further rent away. Thus, the wire 205 is extended between the pad 203 and the lead 204. The wire 205 extended by the reverse bonding has the ball portion 206 in the form of a round rice cake on the lead 204, and has a stitch portion 207 wedged in side elevational view on the pad 203.

A resin-sealed semiconductor device has a structure obtained by sealing a semiconductor chip with a resin package along with a lead frame. The lead frame is formed by punching a metal thin plate, and includes an island (die pad) and a plurality of leads arranged on the periphery of the island. The semiconductor chip is die-bonded to the upper surface of the island, and electrically connected with each lead by a bonding wire extended between the front surface thereof an each lead.

For the die bonding of the semiconductor chip to the island, a pasty bonding agent such as solder paste is employed, for example. After the pasty bonding agent is applied to the upper surface of the island, the semiconductor chip is arranged on the bonding agent, and a load is applied to the semiconductor chip. Thus, the bonding agent is spread between the semiconductor chip and the island, the semiconductor chip and the island are bonded to each other, and the die bonding of the semiconductor chip to the island is achieved.

PRIOR ART

Patent Document

Patent Document 1: Japanese Unexamined Patent Publication No. 2004-207292
Patent Document 2: Japanese Unexamined Patent Publication No. 2003-249616

SUMMARY OF THE INVENTION

Problems to be Solved by the Invention

Referring to FIG. 34, there is a possibility that the wire 205 comes into contact with a corner portion of the semiconductor chip 201 if the capillary C is linearly moved toward the pad 203 after the FAB is bonded to the lead 204. Therefore, the capillary C is temporarily moved to a side separating from the semiconductor chip 201, and thereafter moved toward the pad 203, as shown by broken lines in FIG. 34. However, there is a possibility that the capillary C and the press plate 208 come into contact with each other at this time.

In order to prevent the contact between the capillary C and the press plate 208, therefore, a sufficient clearance is provided between the bonded position of the FAB (the ball portion 206) and the press plate 208. Even if the package size of the semiconductor device is reduced, therefore, the number of semiconductor devices (die pads 202 and leads 204) obtainable from one lead frame cannot be increased.

In the normal bonding, there is no problem of the contact between the capillary C and the press plate 208. If excellent bonding of the wire to the lead can be obtained by the normal bonding, therefore, the number of semiconductor devices obtainable from one lead frame can be increased.

In a case where a pasty bonding agent (solder) is employed, on the other hand, the bonding agent may remarkably protrude from the space between the semiconductor chip and the island to the periphery thereof when a load is applied to the semiconductor chip. This protrusion of the bonding agent may cause the following various inconveniences:

In a case where the island is small, for example, the protruding bonding agent overflows the island. Even if the island is formed sufficiently large as compared with the semiconductor chip, the bonding agent spreads in a space of the island for bonding the wire in a case of extending the wire between the semiconductor chip and the island, whereby bonding is disturbed. In a case where the semiconductor chip is thin, further, the bonding agent extends from a side portion to the front surface of the semiconductor chip, regardless of the size of the island.

In order to solve the problems resulting from spreading of the bonding agent, a DAF (Die Attach Film) may conceivably be employed. The DAF is a filmy bonding agent. In a wafer state of the semiconductor chip, the DAF is pasted to the rear surface thereof. Then, the semiconductor chip and the DAF are collectively diced, whereby such a semiconductor chip that the DAF is pasted to the rear surface thereof is obtained. The semiconductor chip is pressed against the upper portion of the island, whereby the island and the semiconductor chip are bonded to each other, and die bonding of the semiconductor chip to the island is achieved.

However, it is difficult to cut the wafer into a small size (550 μm square, for example) in the state where the DAF is pasted to the rear surface of the wafer, and the DAF cannot be used for bonding a small-sized semiconductor chip to an island.

One object of the present invention is to provide a semiconductor device, in which a wire is excellently bonded to a lead by normal bonding.

Another object of the present invention is to provide a semiconductor device and a production method therefor, capable of preventing occurrence of various problems resulting from spreading of solder also in a small-sized semiconductor chip.

Solutions to Problems

A semiconductor device according to one aspect of the present invention includes a semiconductor chip, a lead arranged on a side portion of the semiconductor chip, and a wire, whose one end and another end are bonded to the semiconductor chip and the lead respectively, having a ball portion and a stitch portion wedged in side elevational view on the semiconductor chip and the lead respectively. In other words, the wire is extended between the semiconductor chip (a pad provided on the front surface of the semiconductor chip) and the lead arranged on the side portion thereof by normal bonding in the semiconductor device according to the present invention. Therefore, the wire has the ball portion on the semiconductor chip, and has the stitch portion wedged in side elevational view on the lead.

In a semiconductor device according to one embodiment, an angle of approach of the wire to the lead, i.e., an angle formed by an end portion of the wire closer to the stitch portion and the lead is not less than 50°.

In this case, excellent bonding of the wire to the lead is achieved without causing cracking in the vicinity of the stitch portion of the wire if the length (length of a contact portion between the wire and the lead in a direction along the wire) of the stitch portion is not less than 33 μm.

Also in a case where an angle formed by the upper surface of the stitch portion and the upper surface of the lead is not less than 15°, excellent bonding of the wire to the lead is achieved without causing cracking in the vicinity of the stitch portion of the wire.

Also when the length of the stitch portion is not less than 33 μm and the angle formed by the upper surface of the stitch portion and the upper surface of the lead is not less than 15°, excellent bonding of the wire to the lead is achieved without causing cracking in the vicinity of the stitch portion of the wire, as a matter of course.

In the semiconductor device according to one embodiment, the length of the wire is not more than 400 μm, and a difference in elevation between a portion of the semiconductor chip to which the ball portion is bonded and a portion of the lead to which the stitch portion is bonded is not less than 200 μm.

If the length of the stitch portion is not less than 33 μm in this case, excellent bonding of the wire to the lead is achieved without causing cracking in the vicinity of the stitch portion of the wire.

Also in a case where the angle formed by the upper surface of the stitch portion and the upper surface of the lead is not less than 15°, excellent bonding of the wire to the lead is achieved without causing cracking in the vicinity of the stitch portion of the wire.

Also when the length of the stitch portion is not less than 33 μm and the angle formed by the upper surface of the stitch portion and the upper surface of the lead is not less than 15°, excellent bonding of the wire to the lead is achieved without causing cracking in the vicinity of the stitch portion of the wire, as a matter of course.

A production method for a semiconductor device according to one aspect of the present invention includes a support body arranging step of arranging a support body made of solid solder on an island, a chip supporting step of placing a semiconductor chip on the support body for making the support body support the semiconductor chip after the support body arranging step, and a bonding step of bonding the island and the semiconductor chip to each other by melting the support body by a heat treatment after the chip supporting step.

According to the production method for a semiconductor device, the support body made of the solid solder is first arranged on the island. Then, the semiconductor chip is placed on the support body. Thus, the semiconductor chip is supported on the support body. Thereafter the support body (solder) is melted by the heat treatment, and the island and the semiconductor chip are bonded to each other.

In the heat treatment, the melted solder spreads between the semiconductor chip and the island, due to surface tension and wettability possessed by the solder. Therefore, no load may be applied to the semiconductor chip in the bonding of the semiconductor chip to the island, dissimilarly to a method employing a pasty bonding agent for bonding the semiconductor chip and the island to each other. No load is applied to the semiconductor chip, whereby spreading of the solder resulting from the load can be prevented. Further, the semiconductor chip and the island can be bonded to each other without causing remarkable protrusion of the solder from a space between the semiconductor chip and the island by varying the magnitude, the shape and the number of the support body in response to the size of the semiconductor chip, regardless of the size of the semiconductor chip. Also in a small-sized semiconductor chip, therefore, die bonding to the island can be achieved without causing various problems resulting from spreading of the solder.

Preferably, the production method further includes a step of forming a thin film made of silver on the island in advance of the support body arranging step, and the support body is arranged on the thin film in the support body arranging step. Wettability of the solder with respect to the silver is so high that the melted support body (solder) spreads in the range where the thin film made of silver is formed when the support body is melted in the heat treatment. Therefore, spreading of the solder can be controlled and occurrence of various problems resulting from spreading of the solder can be reliably prevented by forming the thin film made of silver.

The island may be provided with a recess portion dug down from the upper surface thereof, and the support body may be arranged in the recess portion in the support body arranging step. Thus, the support body can be stably arranged on the island.

The production method may further include a flux applying step of applying a flux to the support body after the support body arranging step, in advance of the chip supporting step. Thus, the front surface of the support body can be prevented from oxidation, and the wettability of the support body (solder) in the heat treatment can be improved. Further, portions of the semiconductor chip and the island in contact with the flux are washed due to action of the flux, whereby adhesiveness between the semiconductor chip and the island can be further improved.

In the case where the flux applying step is included in the production method for a semiconductor device, the flux adheres to a solder bonding agent bonding the semiconductor chip and the island to each other in a semiconductor device produced by the production method. In other words, the semiconductor device produced by the production method including the flux applying step includes a semiconductor chip, an island to whose upper surface the semiconductor chip is bonded, and a solder bonding agent made of solder and interposed between the semiconductor chip and the island for bonding the semiconductor chip and the island to each other, while a flux adheres to the solder bonding agent.

The foregoing and other objects, features and effects of the present invention will become more apparent from the following detailed description of the embodiments with reference to the attached drawings.

MODES FOR CARRYING OUT THE INVENTION

First Embodiment

Figure 1A:
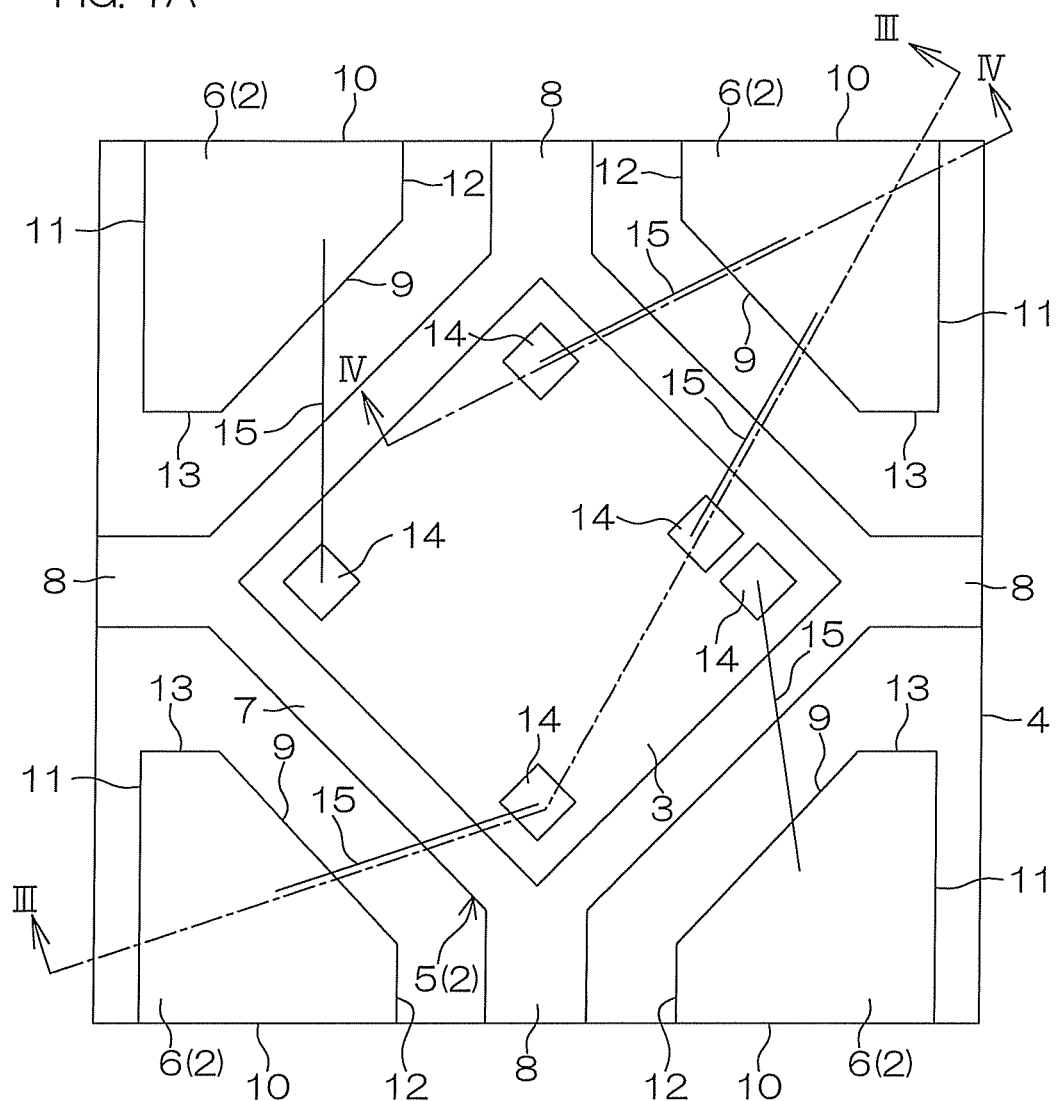
FIG. 1A is a plan view of a semiconductor device according to a first embodiment of the present invention.
Figure 1B:
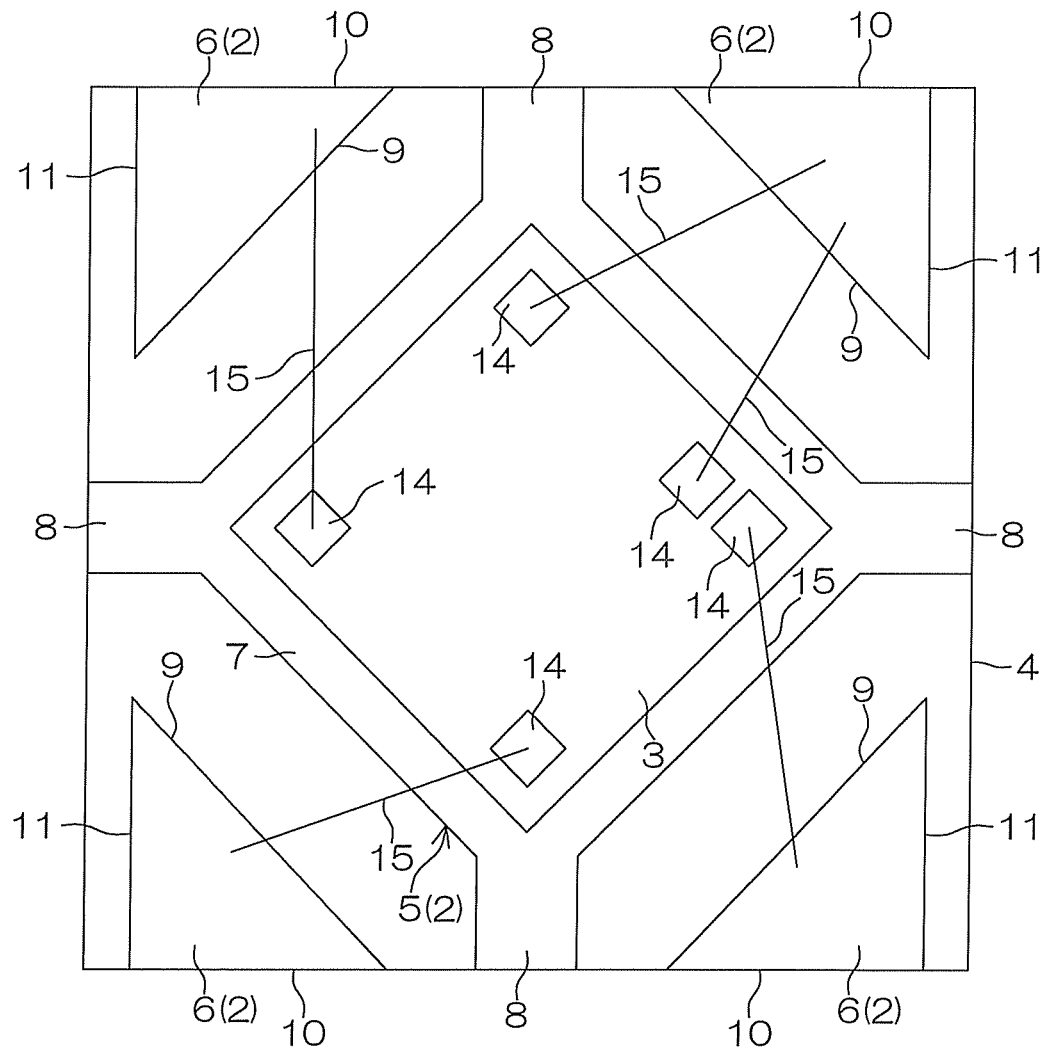
FIG. 1B is a diagram applying a modification to FIG. 1A.
Figure 2A:
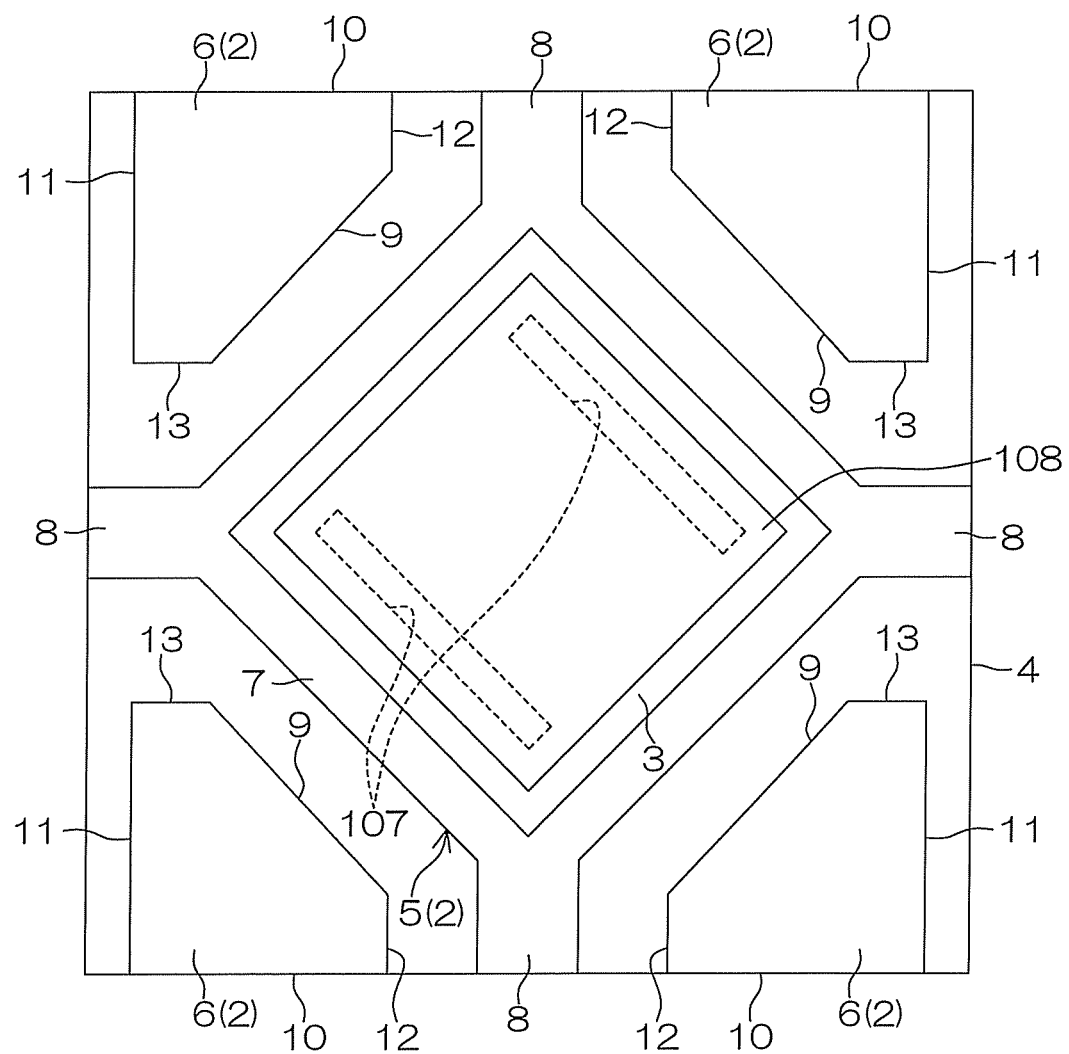
FIG. 2A is a schematic plan view showing a state of omitting a semiconductor chip, wires and a solder bonding agent from the semiconductor device shown in FIG. 1A.
Figure 2B:
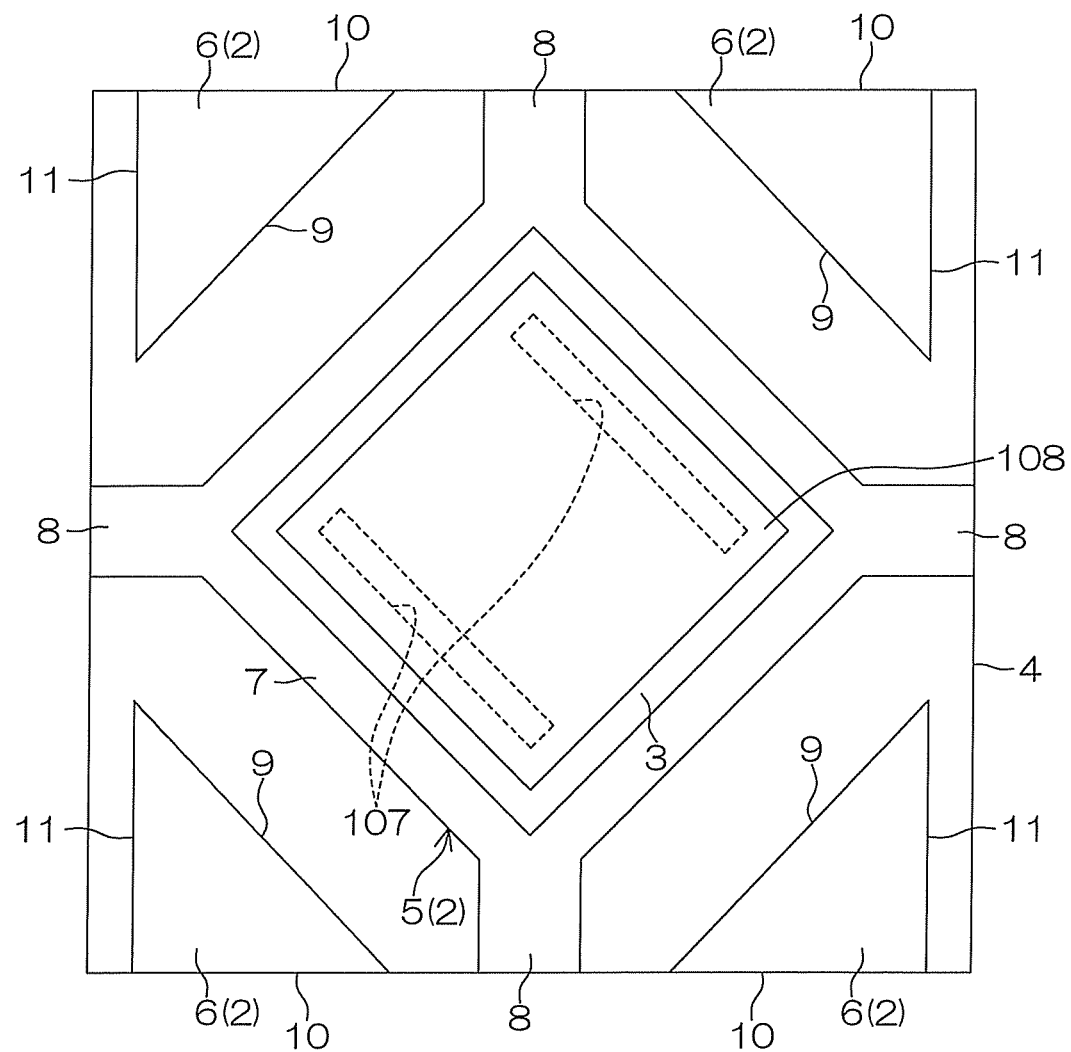
FIG. 2B is a diagram applying a modification to FIG. 2A.
Figure 3:
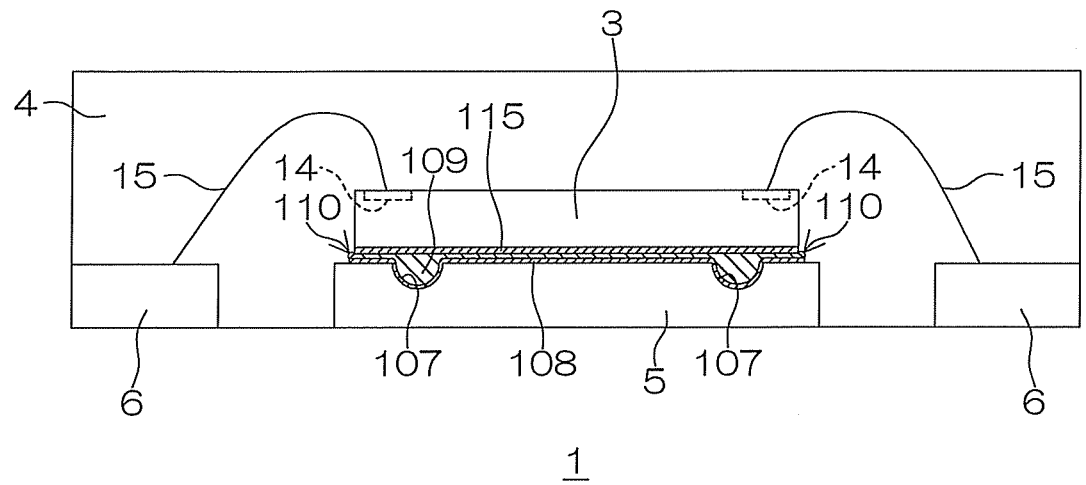
FIG. 3 is a schematic sectional view at a time of cutting the semiconductor device shown in FIG. 1A along a cutting plane line III-III.
Figure 4:
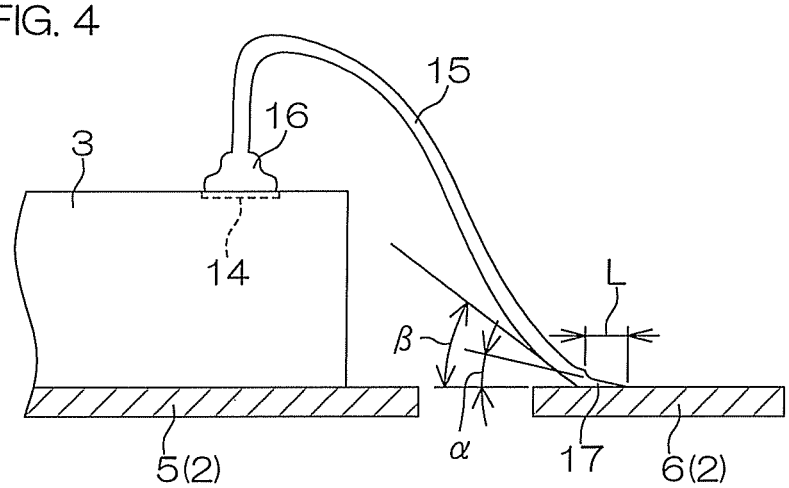
FIG. 4 is a schematic sectional view of the semiconductor device taken along a cutting plane line IV-IV shown in FIG. 1A.

FIG. 1A is a plan view of a semiconductor device according to a first embodiment of the present invention. FIG. 1B is a diagram applying a modification to FIG. 1A. Referring to FIGS. 1A and 1B, respective members sealed in a resin package are perspectively shown by solid lines. FIG. 2A is a schematic plan view showing a state of omitting a semiconductor chip, wires and a solder bonding agent from the semiconductor device shown in FIG. 1A. FIG. 2B is a diagram applying a modification to FIG. 2A. FIG. 3 is a schematic sectional view at a time of cutting the semiconductor device shown in FIG. 1A along a cutting plane line III-III. FIG. 4 is a schematic sectional view of the semiconductor device taken along a cutting plane line IV-IV shown in FIG. 1A. Referring to FIG. 4, illustration of the resin package is omitted.

A semiconductor device 1 has a structure obtained by bonding a semiconductor chip 3 to a lead frame 2 and sealing the same with a resin package 4. The outer shape of the semiconductor device 1 (the resin package 4) is in the form of a flat rectangular parallelepiped (hexahedron square in plan view in this embodiment).

The lead frame 2 includes a die pad (island) 5 arranged on a central portion of the semiconductor device 1 in plan view and four leads 6 arranged on the periphery of the die pad 5, as shown in FIG. 1A. The lead frame 2 is formed by punching a metal thin plate (copper thin plate, for example).

The die pad 5 integrally includes a central portion 7 and hanging portions 8. The central portion 7 is provided in the form of a quadrangle in plan view, whose center overlaps with the center of the resin package 4 in plan view, having four sides inclined by 45° with respect to the respective sides of the resin package 4. The hanging portions 8 are provided in the form of quadrangles in plan view extending from respective corner portions of the central portion 7 toward side surfaces of the resin package 4 to which the corner portions are opposed. The lower surface of the central portion 7 is exposed on the rear surface of the resin package 4.

The central portion 7 is provided with two (a pair of) trench-shaped recess portions 107 dug down from the upper surface thereof (see FIG. 2A). The respective recess portions 107 are provided in the form of semicircles in section, and extend parallelly to two opposed sides of the central portion 7 respectively. On the upper surface of the central portion 7, a thin film 108 made of silver (Ag) is formed in a region including portions where the recess portions 107 are formed in plan view (see FIG. 2A). More specifically, the thin film 108 is formed in a size generally identical to that of a portion of the island 5 opposed to the semiconductor chip 3 in a state where the semiconductor chip 3 is bonded onto the island 5, as shown in FIG. 3.

The leads 6 are arranged one by one on portions opposed to the respective sides of the central portion 7 of the die pad 5 in plan view. The respective leads 6 are provided in the form of trapezoids in plan view. More specifically, the respective leads 6 have sides 9 parallel to opposed sides of the die pad 5, sides 10 extending on the side surfaces of the resin package 4, sides 11 orthogonal to the sides 10 and extending parallelly to the side surfaces of the resin package 4, and sides 12 and 13 connecting the sides 9 and the sides 10 and 11 with one another respectively. The lower surfaces of the respective leads 6 are exposed on the rear surface of the resin package 4, and function as external terminals for connection with a wiring board (not shown). Further, the side surfaces of the respective leads 6 having the sides 10 are exposed on the side surfaces of the resin package 4. The respective leads 6 may be provided in the form of triangles in plan view, as shown in FIGS. 1B and 2B.

As shown in FIG. 3, the rear surface of the semiconductor chip 3 is bonded (die-bonded) to the die pad 5 through a conductive solder bonding agent 109, in a state upwardly directing the front surface (device forming surface) which is an element forming surface. A metal film 115 for improving adhesiveness between the solder bonding agent 109 and the semiconductor chip 3 is applied to the rear surface of the semiconductor chip 3. The metal film 115 is a multilayer film formed by stacking Au (gold), Ni (nickel), Ag and Au in this order from the side of the semiconductor chip 3, for example. A solidified flux 110 solidified in a resinous manner adheres to peripheral edge portions of the solder bonding agent 109, i.e., to side portions of bonded portions of the semiconductor chip 3 and the island 5.

The thickness of the semiconductor chip 3 is not less than 200 μm (230 μm in this embodiment), and there is a difference in elevation responsive to the thickness of the semiconductor chip 3 between the front surface of the semiconductor chip 3 (in detail, the front surfaces of pads 14 described later) and the upper surfaces of the leads 6.

As shown in FIG. 1A, five pads 14 electrically connected with wires (not shown) formed on the semiconductor chip 3 are formed on the front surface of the semiconductor chip 3.

Four pads 14 (hereinafter referred to as "pads 14 on the corner portions") are arranged on the respective corner portions of the semiconductor chip 3. The remaining one pad 14 (hereinafter referred to as "remaining pad 14") is arranged adjacently to the pad 14 on one corner portion.

First ends of wires (bonding wires) 15 are bonded to the respective pads 14. Second ends of the respective wires 15 are bonded to the upper surfaces of the leads 6. More specifically, the second ends of the wires 15 whose first ends are bonded to the four pads 14 on the corner portions are bonded to the upper surfaces of the leads 6 different from one another respectively. The second end of the wire 15 whose first end is bonded to the remaining pad 14 is bonded to the lead 6 closest to the remaining pad 14. Thus, the semiconductor chip 3 is electrically connected with the leads 6 through the wires 15. The length of the wires 15 is not more than 400 μm (300 to 400 μm in this embodiment).

The cutting plane line III-III extends parallelly to both of the wire 15 extending from the pad 14 on the corner portion of the lower end of the semiconductor chip 3 in FIG. 1A and the wire 15 extending from the aforementioned remaining pad 14. While the cutting plane line III-III overlaps with these wires 15 in practice, the same is illustrated on a position slightly deviating from these wires 15, in order to render these wires 15 easily observable. The cutting plane line IV-IV extends parallelly to the wire 15 extending from the pad 14 on the corner portion of the upper end of the semiconductor chip 3 in FIG. 1A. While the cutting plane line IV-IV overlaps with this wire 15 in practice, the same is illustrated on a position slightly deviating from this wire 15, in order to render this wire 15 easily observable.

Figure 34:
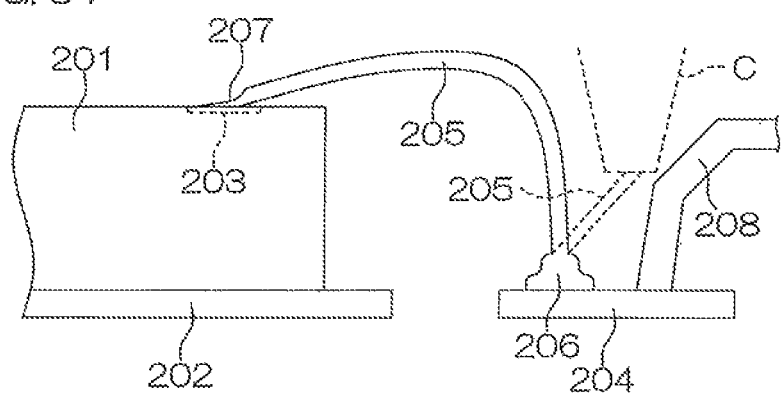
FIG. 34 is a schematic side elevation view of a semiconductor device in which a wire is extended by reverse bonding.

Each wire 15 is formed by normal bonding. In other words, current is applied to a forward end portion of the wire 15 held by a capillary C (see FIG. 34) of a wire bonder in the formation (in wire bonding) of the wire 15, whereby an FAB (Free Air Ball) is formed on the forward end portion. Then, the FAB is pressed against the pad 14, by movement of the capillary C. The FAB is pressed by the capillary C, whereby the FAB is deformed, a ball portion 16 in the form of a round rice cake is formed on the pad 14 as shown in FIG. 4, and bonding (first bonding) of the first end of the wire 15 to the pad 14 is achieved. Thereafter the capillary C is upwardly separated from the pad 14 up to a prescribed height. Then, the capillary C is moved toward the upper surface of the lead 6 at an angle of inclination greater than 50° with respect to the upper surface of the lead 6, and the wire 15 is pressed against the upper surface of the lead 6, and further rent away. Thus, the second end of the wire 15 is deformed, a stitch portion 17 wedged in side elevational view is formed on the lead 6, and bonding (second bonding) of the second end of the wire 15 to the lead 6 is achieved. Therefore, the wire 15 has the ball portion 16 on the pad 14, and has the stitch portion 17 on the lead 6.

At the time of the second bonding, the capillary C is moved at the angle of inclination greater than 50° with respect to the upper surface of the lead 6, whereby an angle of approach of the wire 15 to the upper surface of the lead 6, i.e., an angle β formed by an end portion of the wire 15 closer to the stitch portion 17 and the upper surface of the lead 6 is not less than 50°.

In the semiconductor device 1, the length (length of a contact portion between the wire 15 and the lead 6 in a direction along the wire 15) L of the stitch portion 17 is not less than 33 μm. Further, an angle α formed by the upper surface of the stitch portion 17 and the upper surface of the lead 6 is not less than 15°.

Thus, excellent bonding of the wire 15 to the lead 6 is achieved without causing cracking in the vicinity of the stitch portion 17 of the wire 15, even if the angle of approach of the wire 15 to the upper surface of the lead 6 is not less than 50°. Further, excellent bonding of the wire 15 to the lead 6 is achieved without causing cracking in the vicinity of the stitch portion 17 of the wire 15, even if the length of the wire 15 is not more than 400 µm and a difference in elevation between the front surface of the semiconductor chip 3 and the upper surface of the lead 6 is not less than 200 µm.

FIGS. 5A to 5E are schematic sectional views for illustrating production steps for the semiconductor device shown in FIGS. 1A and 1B in order. Referring to FIGS. 5A to 5E, illustration of the leads 6 and the bonding wires 15 etc. is omitted.

Figure 5A:
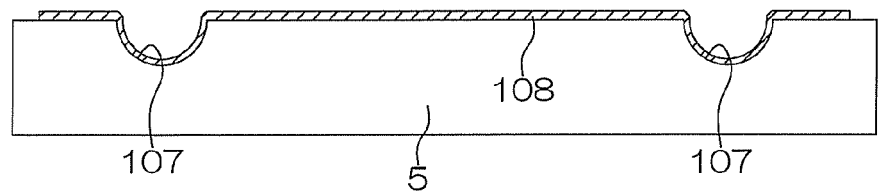
FIG. 5A is a schematic sectional view showing a production step for the semiconductor device shown in FIG. 1A.

First, the lead frame 2 including the island 5 provided with the recess portions 107 is prepared. The lead frame 2 is formed by pressing and punching a copper thin plate, for example. Then, the thin film 108 made of silver is formed on the island 5 by plating or sputtering, as shown in FIG. 5A. At this time, the thin film 108 is formed also on the inner surfaces of the recess portions 107.

Figure 5B:
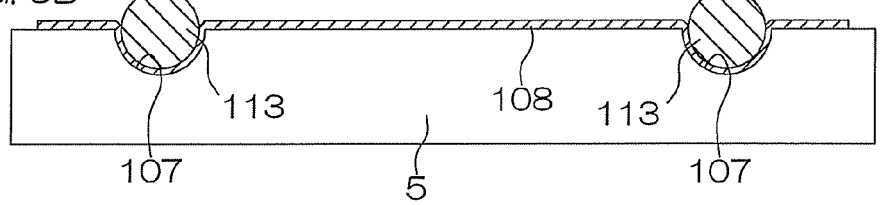
FIG. 5B is a schematic sectional view showing a step subsequent to FIG. 5A.

Then, support bodies 113 made of solid solder are arranged on the thin film 108 in the recess portions 107, as shown in FIG. 5B. The support bodies 113 are formed in shapes generally identical to those of the recess portions 107 in plan view, and have circular sections.

Figure 5C:
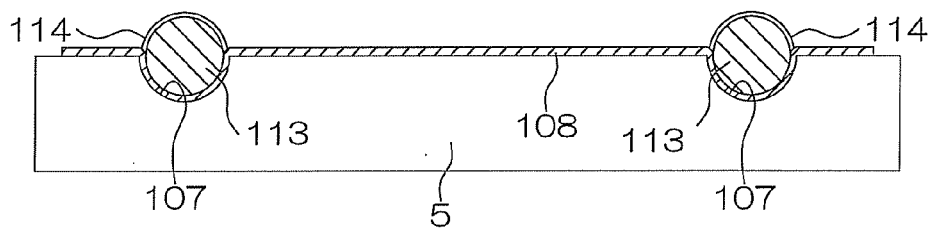
FIG. 5C is a schematic sectional view showing a step subsequent to FIG. 5B.

Thereafter a flux 114 is applied to the support bodies 113, as shown in FIG. 5C. The flux 114 may be collectively applied to the whole area of the upper surface of the island 5, or may be selectively applied to portions of the support bodies 113 exposed from the recess portions 107.

Figure 5D:
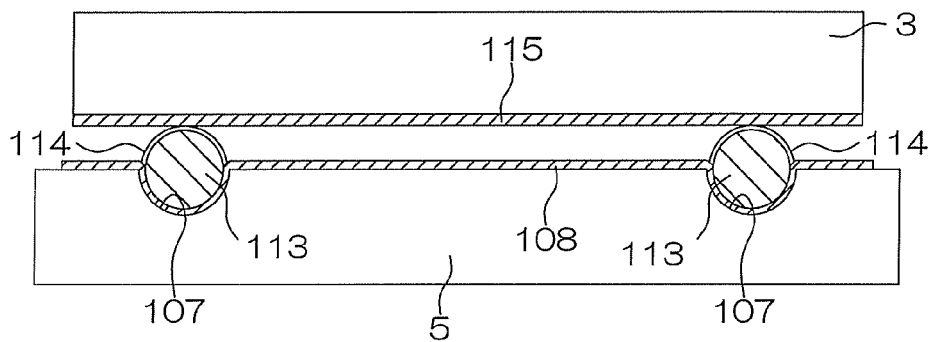
FIG. 5D is a schematic sectional view showing a step subsequent to FIG. 5C.

Then, the semiconductor chip 3 is placed on the support bodies 113, as shown in FIG. 5D. Thus, the semiconductor chip 3 is supported on the support bodies 113.

Figure 5E:
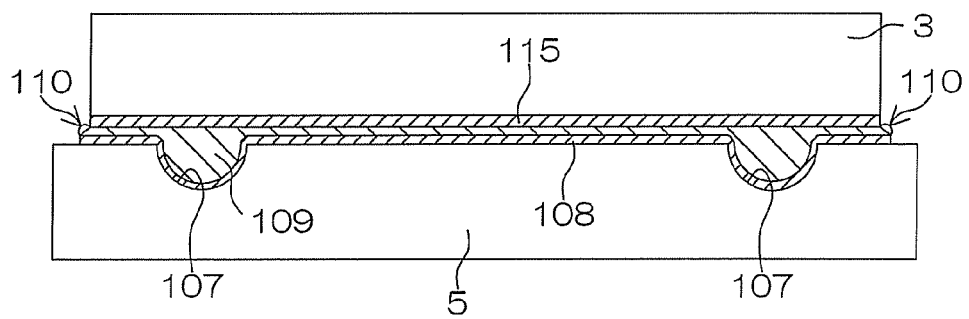
FIG. 5E is a schematic sectional view showing a step subsequent to FIG. 5D.

In a case where the support bodies 113 are lead solder, for example, a heat treatment for 30 sec. is performed under a temperature condition of 340° C., whereby the support bodies 113 are melted, and the support bodies 113 spread in the range where the thin film 108 is formed due to surface tension and wettability thereof, as shown in FIG. 5E. Thus, a clearance between opposed portions of the semiconductor chip 3 and the island 5 is filled up with the melted support bodies 113 (the solder bonding agent 109), and bonding between the semiconductor chip 3 and the island 5 is achieved. At this time, the flux 114 aggregates and is solidified on the side portions of the semiconductor chip 3 while washing the lower surface of the semiconductor chip 3 (the front surface of the metal film 115) and the upper surface of the island 5, to become the solidified flux 110.

Thereafter the bonding wires 15 are extended between the semiconductor chip 3 and the leads 6 and the resin package 4 is so formed that only the rear surfaces of the island 5 and the leads 6 are exposed, whereby the semiconductor device 1 shown in FIGS. 1A to 3 is obtained.

As hereinabove described, the melted solder spreads between the semiconductor chip 3 and the island 5 in the heat treatment, due to the surface tension and the wettability possessed by the solder. Therefore, no load may be applied to the semiconductor chip 3 in the bonding of the semiconductor chip 3 to the island 5, dissimilarly to a method employing a pasty adhesive for the bonding of the semiconductor chip 3 and the island 5. No load is applied to the semiconductor chip 3, whereby spreading of the solder by the load can be prevented. Further, the semiconductor chip 3 and the island 5 can be bonded to each other without causing remarkable protrusion of the solder from a space between the semiconductor chip 3 and the island 5 by varying the magnitude, the shape and the number of the support bodies 113 in response to the size of the semiconductor chip 3, regardless of the size of the semiconductor chip 3. Even in a small-sized semiconductor chip 3, therefore, die bonding to the island 5 can be achieved without causing various problems resulting from spreading of the solder.

The support bodies 113 are arranged on the thin film 108 made of silver. The wettability of the solder with respect to the silver is so high that, when the support bodies 113 are melted in the heat treatment, the melted support bodies 113 spread in the range where the thin film 108 made of silver is formed. Therefore, spreading of the support bodies 113 can be controlled and occurrence of various problems resulting from spreading of the solder can be reliably prevented by forming the thin film 108 made of silver.

Further, the island 5 is provided with the recess portions 107 dug down from the upper surface thereof, and the support bodies 113 are arranged in the recess portions 107. Thus, the support bodies 113 can be stably arranged on the island 5.

In addition, the flux 114 is applied to the support bodies 113, whereby the front surfaces of the support bodies 113 can be prevented from oxidation, and the wettability of the support bodies 113 (solder) in the heat treatment can be improved. Further, portions of the semiconductor chip 3 and the island 5 in contact with the flux 114 are washed due to action of the flux 114, whereby adhesiveness between the semiconductor chip 3 and the island 5 can be further improved.

Figure 6:
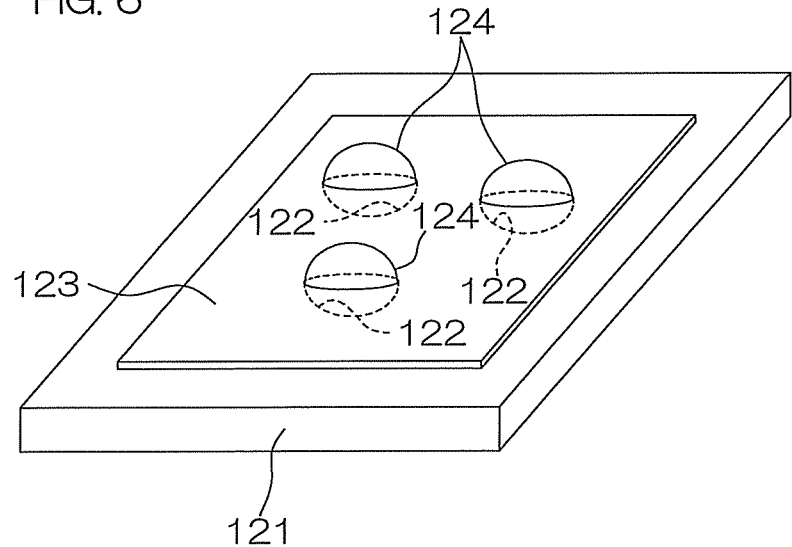
FIG. 6 is a perspective view showing another structure of an island and support bodies.

FIG. 6 is a perspective view showing another structure of the island and the support bodies.

An island 121 shown in FIG. 6 can be employed in place of the island 5 shown in FIG. 1A.

The island 121 is quadrangular in plan view. The island 121 is provided with three recess portions 122 semispherically dug down from the upper surface thereof. The respective recess portions 122 are arranged at intervals from one another so that the inside of lines connecting the same with one another is in the form of a triangle.

On the upper surface of the island 122, a thin film 123 made of silver is formed in a region including portions where the recess portions 122 are formed in plan view. More specifically, the thin film 123 is formed in a size generally identical to that of a portion of the island 121 opposed to the semiconductor chip 3 in a state where the semiconductor chip 3 (see FIG. 1A) is bonded onto the island 121. The thin film 123 is formed also on the inner surfaces of the respective recess portions 122.

Support bodies 124 are arranged on the thin film 123 in the recess portions 122. The support bodies 124 are provided in the form of spheres having a diameter generally identical to that of the recess portions 122.

When the semiconductor chip 3 is placed on the three support bodies 124 and a heat treatment is performed, the support bodies 124 are melted, and the support bodies 124 (solder) spread in the range where the thin film 123 is formed due to surface tension and wettability thereof. Thus, a clearance between opposed portions of the semiconductor chip 3 and the island 121 is filled up with the melted support bodies 124, and bonding between the semiconductor chip 3 and the island 121 is achieved.

Figure 7:
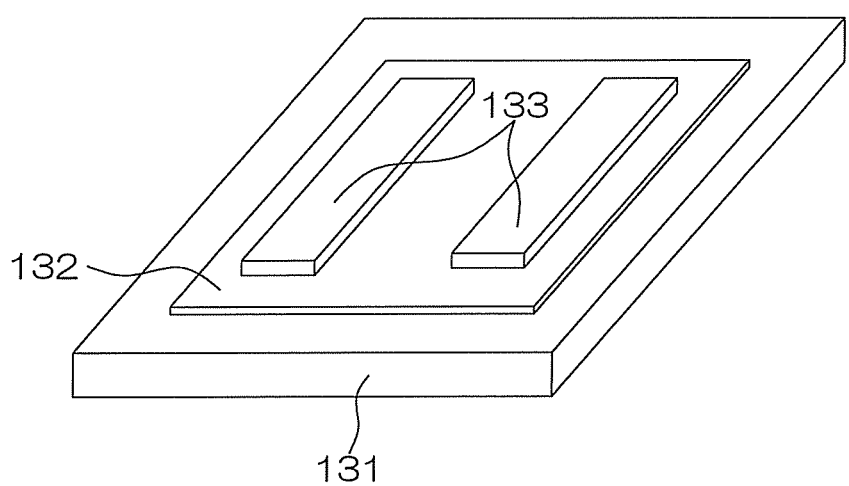
FIG. 7 is a perspective view showing still another structure of the island and the support bodies.

FIG. 7 is a perspective view showing still another structure of the island and the support bodies.

An island 131 shown in FIG. 7 can be employed in place of the island 5 shown in FIG. 1A.

The island 131 is quadrangular in plan view. A thin film 132 made of silver is formed on the upper surface of the island 131. More specifically, the thin film 132 is formed in a size generally identical to that of a portion of the island 131 opposed to the semiconductor chip 3 in a state where the semiconductor chip 3 (see FIG. 1A) is bonded onto the island 131.

Two support bodies 133 are arranged on the thin film 132. The support bodies 133 are provided in the form of slender plates (in the form of ribbons) in plan view, and parallelly extend at an interval from each other.

When the semiconductor chip 3 is placed on the two support bodies 133 and a heat treatment is performed, the support bodies 133 are melted, and the support bodies 133 (solder) spread in the range where the thin film 132 is formed due to surface tension and wettability thereof. Thus, a clearance between opposed portions of the semiconductor chip 3 and the island 131 is filled up with the melted support bodies 133, and bonding between the semiconductor chip 3 and the island 131 is achieved.

While a QFN (Quad Flat Non-leaded Package) is applied to the semiconductor device 1 according to this embodiment, this embodiment can also be applied to a semiconductor device to which another type of non-leaded package such as an SON (Small Outlined Non-leaded Package) is applied.

Further, this embodiment is not restricted to the so-called singulation type package so formed that end surfaces of leads and side surfaces of sealing resin are flush with one another, but can also be applied to a semiconductor device to which a lead-cut type non-leaded package in which leads protrude from side surfaces of sealing resin is applied.

In addition, this embodiment is not restricted to the non-leaded package, but can also be applied to a semiconductor device to which a package, such as a QFP (Quad Flat Package), having outer leads resulting from protrusion of leads from sealing resin is applied.

While the so-called surface-mounted semiconductor device in which rear surfaces of leads and an island are exposed from a rear surface of a resin package has been illustrated as the semiconductor device 1, this embodiment may be applied to a resin-sealed semiconductor device in which leads extend toward side portions of a resin package. In other words, this embodiment can be widely applied to a semiconductor device having a structure obtained by bonding a semiconductor chip onto an island.

While the present invention is now described with reference to Examples and comparative example, the present invention is not restricted by the following Examples.

1. Example 1

Figure 8:
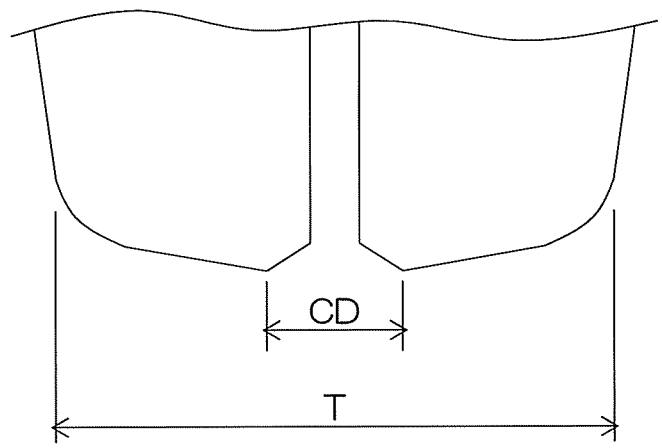
FIG. 8 is an illustrative sectional view showing a forward end shape of a capillary employed in Example 1.

A gold wire having a wire diameter of 25 µm was extended between a pad and a lead on a front surface of a semiconductor chip by normal bonding, by employing a capillary shown in FIG. 8. A T dimension of the capillary shown in FIG. 8 is 130 µm, and a CD dimension is 50 µm. An angle of approach of the wire to the upper surface of the lead is 50°.

Figure 9:
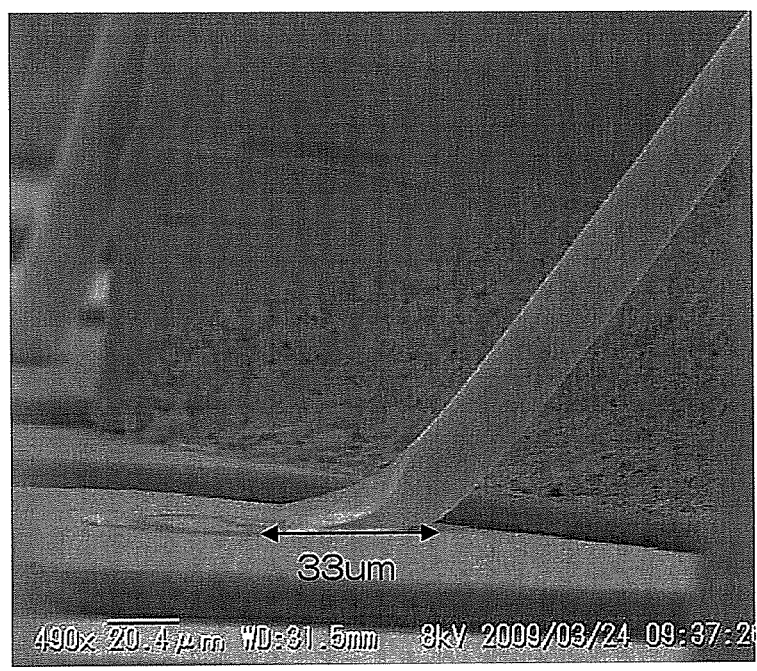
FIG. 9 is a SEM image (number one) in the vicinity of a stitch portion obtained in Example 1.
Figure 10:
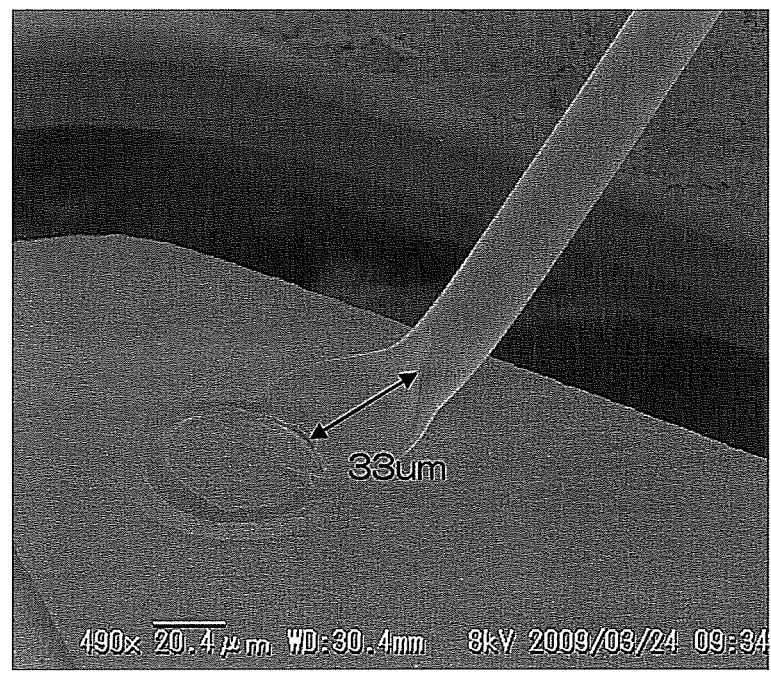
FIG. 10 is a SEM image (number two) in the vicinity of the stitch portion obtained in Example 1.
Figure 11:
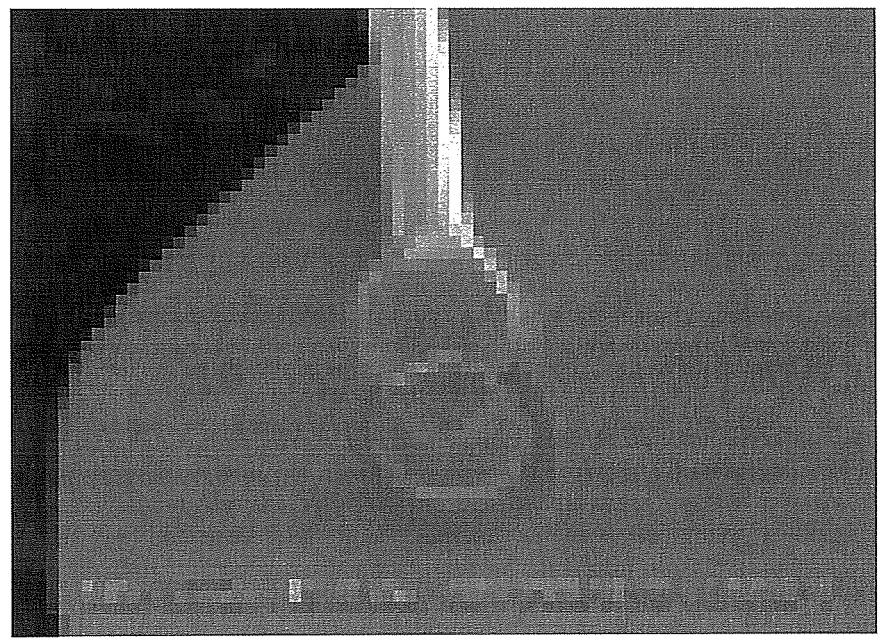
FIG. 11 is a SEM image (number three) in the vicinity of the stitch portion obtained in Example 1.

Then, a portion (stitch portion) of the gold wire bonded to the lead was observed with a scanning electron microscope (SEM: Scanning Electron Microscope). FIGS. 9 to 11 show SEM images at that time.

As shown in FIGS. 9 to 11, it has been confirmed that a stitch portion having a length of 33 µm was formed and no defects such as cracks were formed in the vicinity of the stitch portion in Example 1.

2. Example 2

Figure 12:
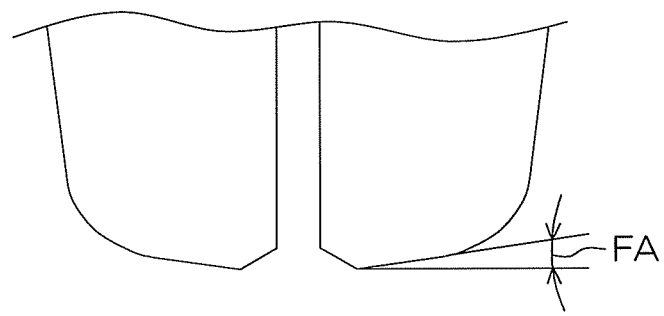
FIG. 12 is an illustrative sectional view showing a forward end shape of a capillary employed in Example 2.

A gold wire having a wire diameter of 25 µm was extended between a pad and a lead on a front surface of a semiconductor chip by normal bonding, by employing a capillary shown in FIG. 12. An FA (Face Angle) of the capillary shown in FIG. 12 is 15°. An angle of approach of the wire to the upper surface of the lead is 50°.

Figure 13:
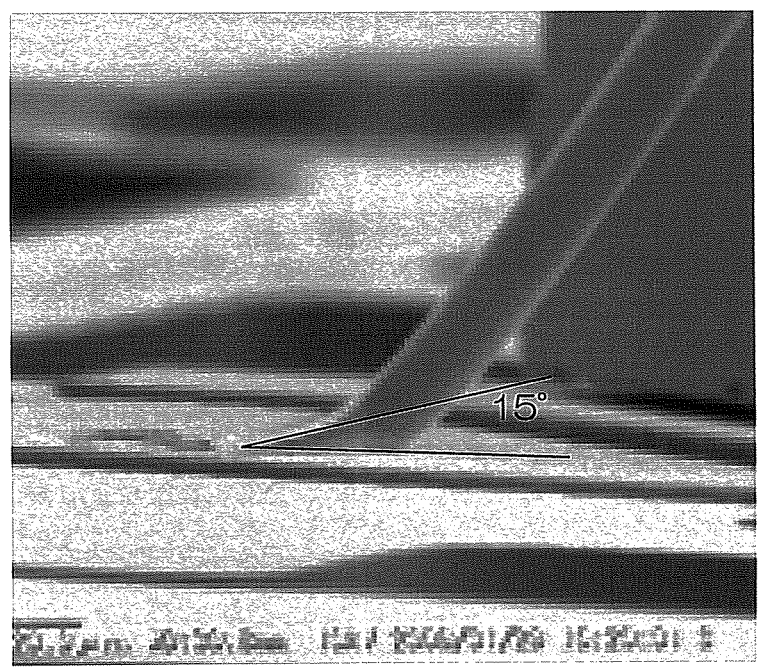
FIG. 13 is a SEM image (number one) in the vicinity of a stitch portion obtained in Example 2.
Figure 14:
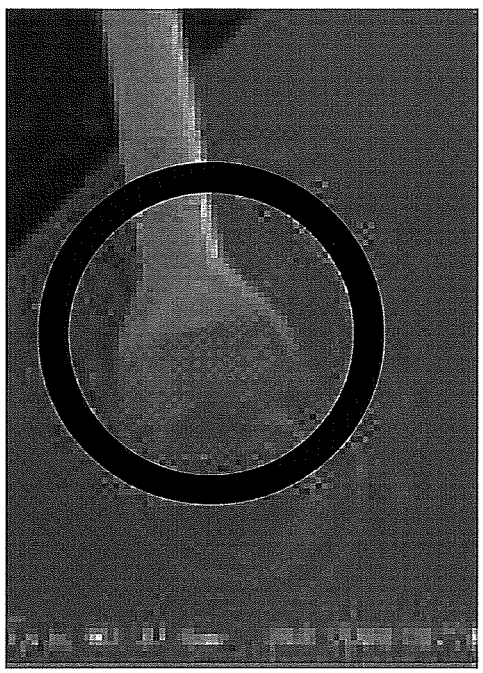
FIG. 14 is a SEM image (number two) in the vicinity of the stitch portion obtained in Example 2.

Then, a portion (stitch portion) of the gold wire bonded to the lead was observed with a scanning electron microscope. FIGS. 13 and 14 show SEM images at that time.

As shown in FIGS. 13 and 14, it has been confirmed that such a stitch portion that an angle α formed by the upper surface thereof and the upper surface of the lead is 15° was formed and no defects such as cracks were formed in the vicinity of the stitch portion in Example 2.

3. Comparative Example

Figure 15:
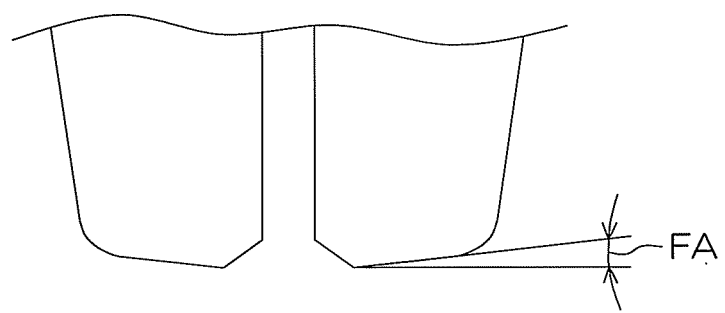
FIG. 15 is an illustrative sectional view showing a forward end shape of a capillary employed in comparative example.

A gold wire having a wire diameter of 25 µm was extended between a pad and a lead on a front surface of a semiconductor chip by normal bonding, by employing a capillary shown in FIG. 15. An FA (Face Angle) of the capillary shown in FIG. 15 is 11°. An angle of approach of the wire to the upper surface of the lead is 50°.

Figure 16:
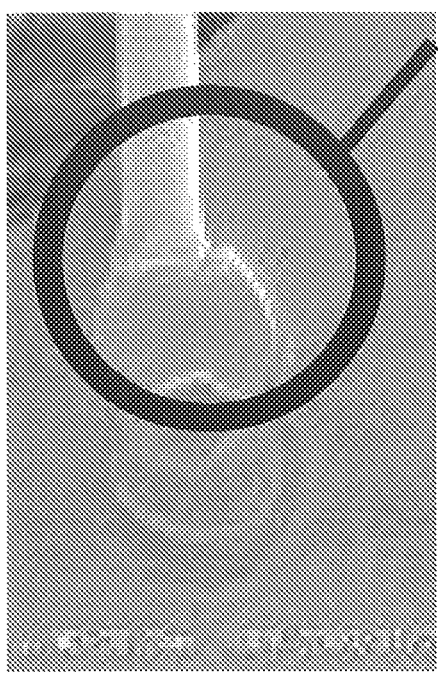
FIG. 16 is a SEM image in the vicinity of a stitch portion obtained in comparative example.

Then, a portion (stitch portion) of the gold wire bonded to the lead was observed with a scanning electron microscope. FIG. 16 shows a SEM image at that time.

As shown in FIG. 16, it has been confirmed that cracks were formed in the vicinity of the stitch portion in comparative example.

Second Embodiment

Figure 17:
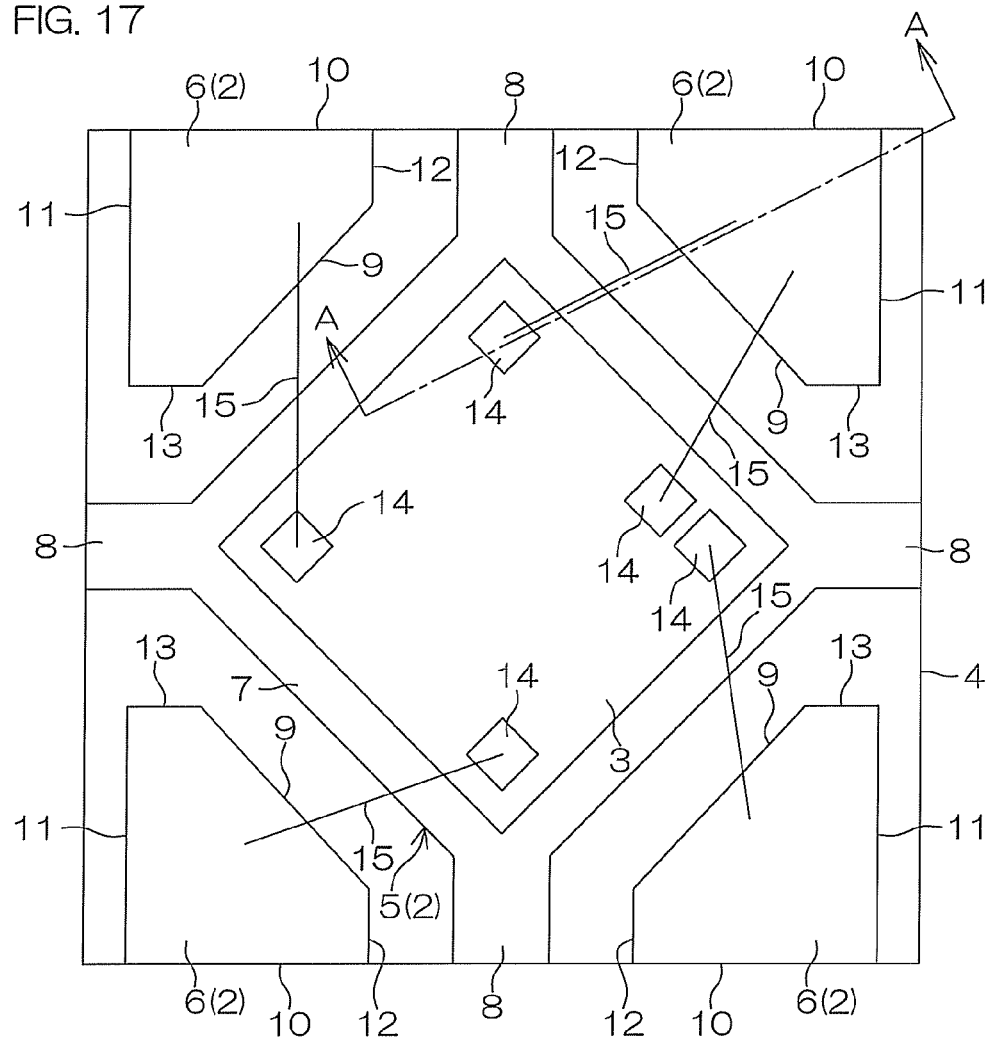
FIG. 17 is a plan view of a semiconductor device according to a second embodiment of the present invention.
Figure 18:
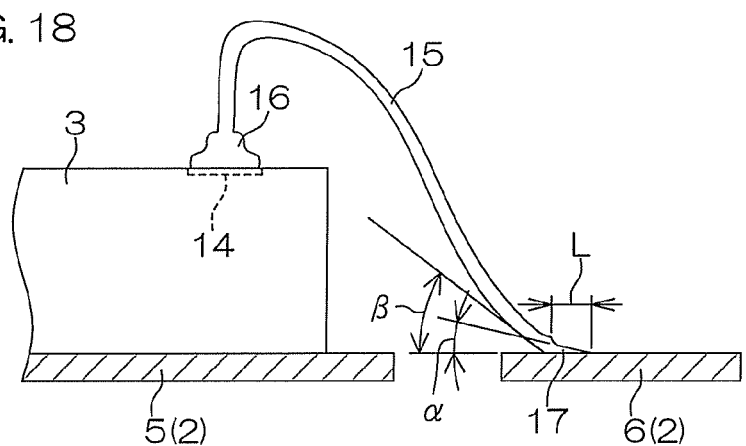
FIG. 18 is a schematic sectional view of the semiconductor device taken along a cutting plane line A-A shown in FIG. 17.

FIG. 17 is a plan view of a semiconductor device according to a second embodiment of the present invention. Referring to FIG. 17, respective members sealed in a resin package are perspectively shown by solid lines. FIG. 18 is a schematic sectional view of the semiconductor device taken along a cutting plane line A-A shown in FIG. 17. Referring to FIG. 18, illustration of the resin package is omitted. In the description of this embodiment, it is assumed that portions corresponding to the respective portions in the first embodiment are denoted by the same reference numerals.

A semiconductor device 1 has a structure obtained by bonding a semiconductor chip 3 to a lead frame 2 and sealing the same with a resin package 4. The outer shape of the semiconductor device 1 (the resin package 4) is in the form of a flat rectangular parallelepiped (hexahedron square in plan view in this embodiment).

The lead frame 2 includes a die pad 5 arranged on a central portion of the semiconductor device 1 in plan view and four leads 6 arranged on the periphery of the die pad 5, as shown in FIG. 17. The lead frame 2 is formed by punching a metal thin plate (copper thin plate, for example).

The die pad 5 integrally includes a central portion 7 and hanging portions 8. The central portion 7 is provided in the form of a quadrangle in plan view, whose center overlaps with the center of the resin package 4 in plan view, having four sides inclined by 45° with respect to the respective sides of the resin package 4. The hanging portions 8 are provided in the form of quadrangles in plan view extending from respective corner portions of the central portion 7 toward side surfaces of the resin package 4 to which the corner portions are opposed. The lower surface of the central portion 7 is exposed on the rear surface of the resin package 4.

The leads 6 are arranged one by one on portions opposed to the respective sides of the central portion 7 of the die pad 5. The respective leads 6 are provided in the form of trapezoids in plan view. More specifically, the respective leads 6 have sides 9 parallel to opposed sides of the die pad 5, sides 10 extending on the side surfaces of the resin package 4, sides 11 orthogonal to the sides 10 and extending parallelly to the side surfaces of the resin package 4, and sides 12 and 13 connecting the sides 9 and the sides 10 and 11 with one another respectively. The lower surfaces of the respective leads 6 are exposed on the rear surface of the resin package 4, and function as external terminals for connection with a wiring board (not shown). Further, the side surfaces of the respective leads 6 having the sides 10 are exposed on the side surfaces of the resin package 4.

The rear surface of the semiconductor chip 3 is bonded (die-bonded) to the die pad 5 through a conductive bonding agent (not shown) in a state upwardly directing the front surface which is an element forming surface. The thickness of the semiconductor chip 3 is not less than 200 µm (230 µm in this embodiment), and there is a difference in elevation responsive to the thickness of the semiconductor chip 3 between the front surface of the semiconductor chip 3 (in detail, the front surfaces of pads 14 described later) and the upper surfaces of the leads 6.

Five pads 14 electrically connected with wires (not shown) formed on the semiconductor chip 3 are formed on the front surface of the semiconductor chip 3. Four pads 14 (hereinafter referred to as "pads 14 on the corner portions") are arranged on the respective corner portions of the semiconductor chip 3. The remaining one pad 14 (hereinafter referred to as "remaining pad 14") is arranged adjacently to the pad 14 on one corner portion.

First ends of wires 15 are bonded to the respective pads 14. Second ends of the respective wires 15 are bonded to the upper surfaces of the leads 6. More specifically, the second ends of the wires 15 whose first ends are bonded to the four pads 14 on the corner portions are bonded to the upper surfaces of the leads 6 different from one another respectively. The second end of the wire 15 whose first end is bonded to the remaining pad 14 is bonded to the lead 6 closest to the remaining pad 14. Thus, the semiconductor chip 3 is electrically connected with the leads 6 through the wires 15. The length of the wires 15 is not more than 400 µm (300 to 400 µm in this embodiment).

The cutting plane line A-A extends parallelly to the wire 15 extending from the pad 14 on the corner portion of the upper end of the semiconductor chip 3 in FIG. 17. While the cutting plane line A-A overlaps with this wire 15 in practice, the same is illustrated on a position slightly deviating from this wire 15, in order to render this wire 15 easily observable.

Each wire 15 is formed by normal bonding. In other words, current is applied to a forward end portion of the wire 15 held by a capillary C (see FIG. 34) of a wire bonder in the formation (in wire bonding) of the wire 15, whereby an FAB (Free Air Ball) is formed on the forward end portion. Then, the FAB is pressed against the pad 14, by movement of the capillary C. The FAB is pressed by the capillary C, whereby the FAB is deformed, a ball portion 16 in the form of a round rice cake is formed on the pad 14 as shown in FIG. 18, and bonding (first bonding) of the first end of the wire 15 to the pad 14 is achieved. Thereafter the capillary C is upwardly separated from the pad 14 up to a prescribed height. Then, the capillary C is moved toward the upper surface of the lead 6 at an angle of inclination greater than 50° with respect to the upper surface of the lead 6, and the wire 15 is pressed against the upper surface of the lead 6, and further rent away. Thus, the second end of the wire 15 is deformed, a stitch portion 17 wedged in side elevational view is formed on the lead 6, and bonding (second bonding) of the second end of the wire 15 to the lead 6 is achieved. Therefore, the wire 15 has the ball portion 16 on the pad 14, and has the stitch portion 17 on the lead 6.

At the time of the second bonding, the capillary C is moved at the angle of inclination greater than 50° with respect to the upper surface of the lead 6, whereby an angle of approach of the wire 15 to the upper surface of the lead 6, i.e., an angle β formed by an end portion of the wire 15 closer to the stitch portion 17 and the upper surface of the lead 6 is not less than 50°.

In the semiconductor device 1, the length (length of a contact portion between the wire 15 and the lead 6 in a direction along the wire 15) L of the stitch portion 17 is not less than 33 µm. Further, an angle α formed by the upper surface of the stitch portion 17 and the upper surface of the lead 6 is not less than 15°.

Thus, excellent bonding of the wire 15 to the lead 6 is achieved without causing cracking in the vicinity of the stitch portion 17 of the wire 15, even if the angle of approach of the wire 15 to the upper surface of the lead 6 is not less than 50°. Further, excellent bonding of the wire 15 to the lead 6 is achieved without causing cracking in the vicinity of the stitch portion 17 of the wire 15, even if the length of the wire 15 is not more than 400 µm and a difference in elevation between the front surface of the semiconductor chip 3 and the upper surface of the lead 6 is not less than 200 µm.

While a QFN (Quad Flat Non-leaded Package) is applied to the semiconductor device 1 according to this embodiment, this embodiment can also be applied to a semiconductor device to which another type of non-leaded package such as an SON (Small Outlined Non-leaded Package) is applied.

Further, this embodiment is not restricted to the so-called singulation type package so formed that end surfaces of leads and side surfaces of sealing resin are flush with one another, but can also be applied to a semiconductor device to which a lead-cut type non-leaded package in which leads protrude from side surfaces of sealing resin is applied.

In addition, this embodiment is not restricted to the non-leaded package, but can also be applied to a semiconductor device to which a package, such as a QFP (Quad Flat Package), having outer leads resulting from protrusion of leads from sealing resin is applied.

While the present invention is now described with reference to Examples and comparative example, the present invention is not restricted by the following Examples.

1. Example 1

Figure 19:
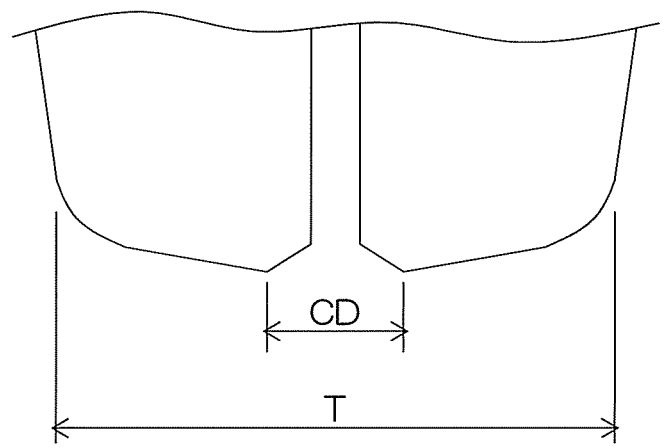
FIG. 19 is an illustrative sectional view showing a forward end shape of a capillary employed in Example 1.

A gold wire having a wire diameter of 25 µm was extended between a pad and a lead on a front surface of a semiconductor chip by normal bonding, by employing a capillary shown in FIG. 19. A T dimension of the capillary shown in FIG. 19 is 130 µm, and a CD dimension is 50 µm. An angle of approach of the wire to the upper surface of the lead is 50°.

Figure 20:
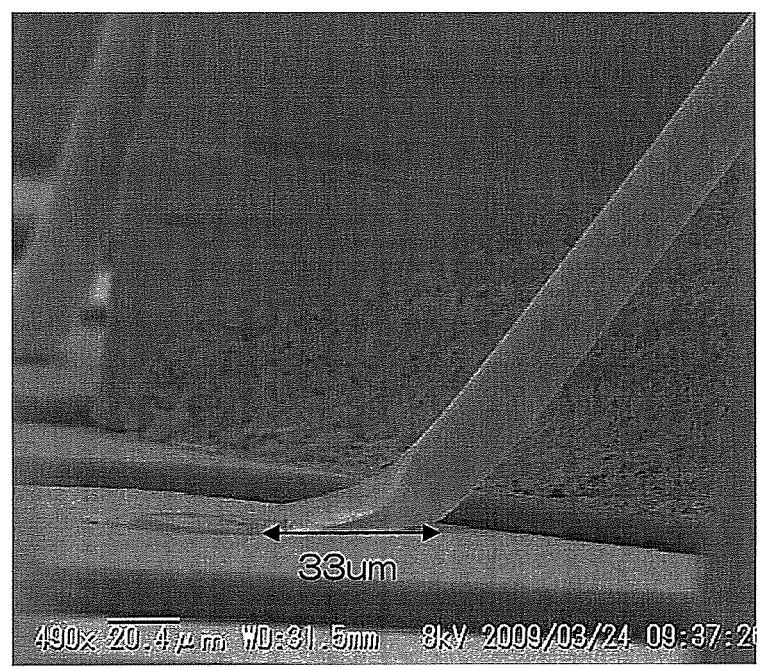
FIG. 20 is a SEM image (number one) in of a stitch portion obtained in Example 1.
Figure 21:
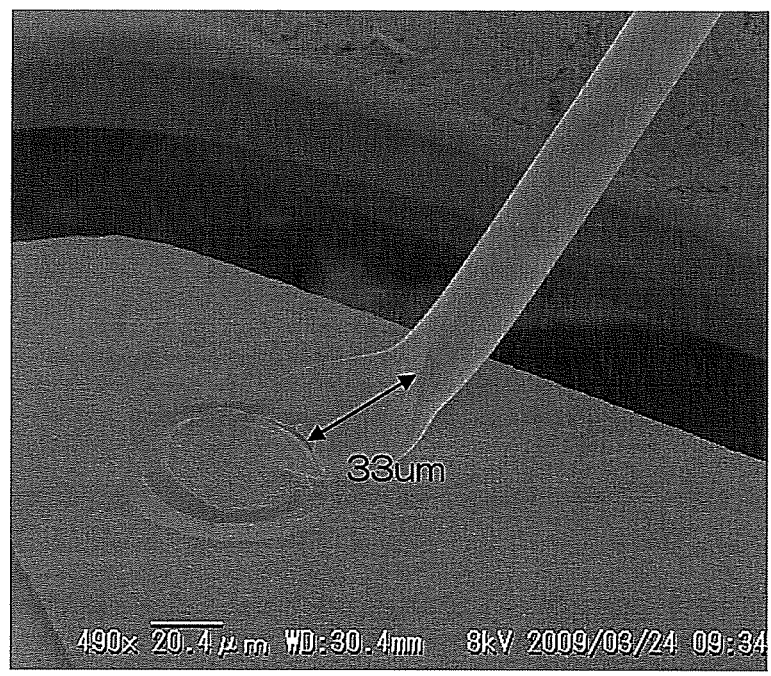
FIG. 21 is a SEMimage(number two) in of the stitch portion obtained in Example 1.
Figure 22:
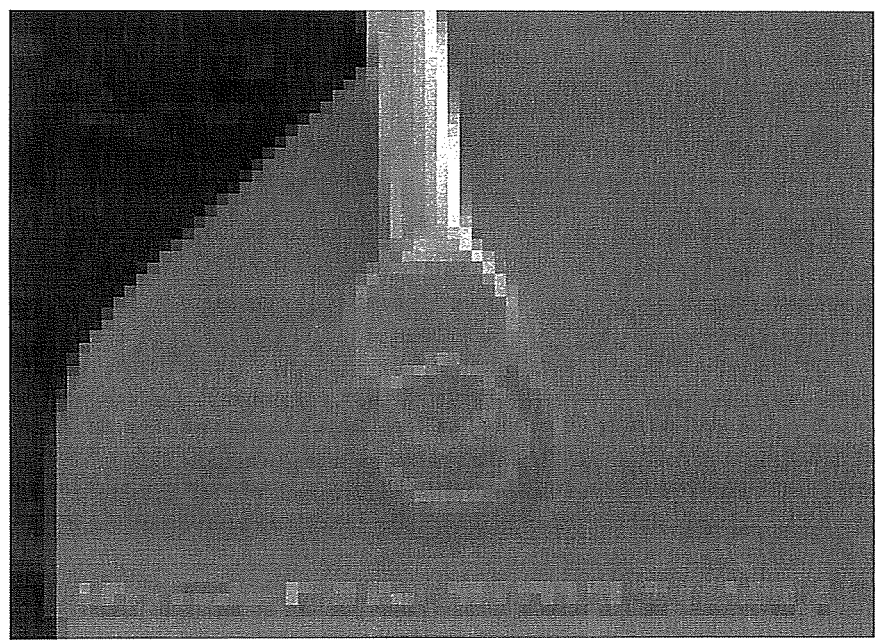
FIG. 22 is a SEM image (number three) in the vicinity of the stitch portion obtained in Example 1.

Then, a portion (stitch portion) of the gold wire bonded to the lead was observed with a scanning electron microscope (SEM: Scanning Electron Microscope). FIGS. 20 to 22 show SEM images at that time.

As shown in FIGS. 20 to 22, it has been confirmed that a stitch portion having a length of 33 µm was formed and no defects such as cracks were formed in the vicinity of the stitch portion in Example 1.

2. Example 2

Figure 23:
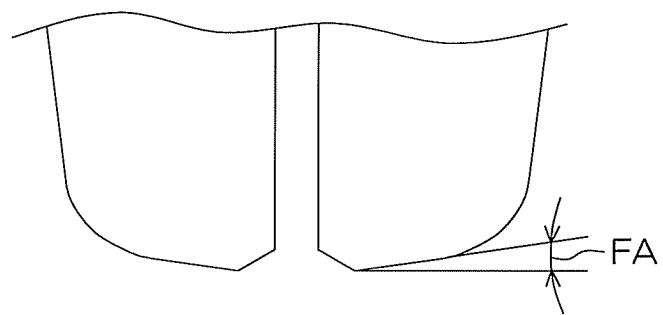
FIG. 23 is an illustrative sectional view showing a forward end shape of a capillary employed in Example 2.

A gold wire having a wire diameter of 25 µm was extended between a pad and a lead on a front surface of a semiconductor chip by normal bonding, by employing a capillary shown in FIG. 23. An FA (Face Angle) of the capillary shown in FIG. 23 is 15°. An angle of approach of the wire to the upper surface of the lead is 50°.

Figure 24:
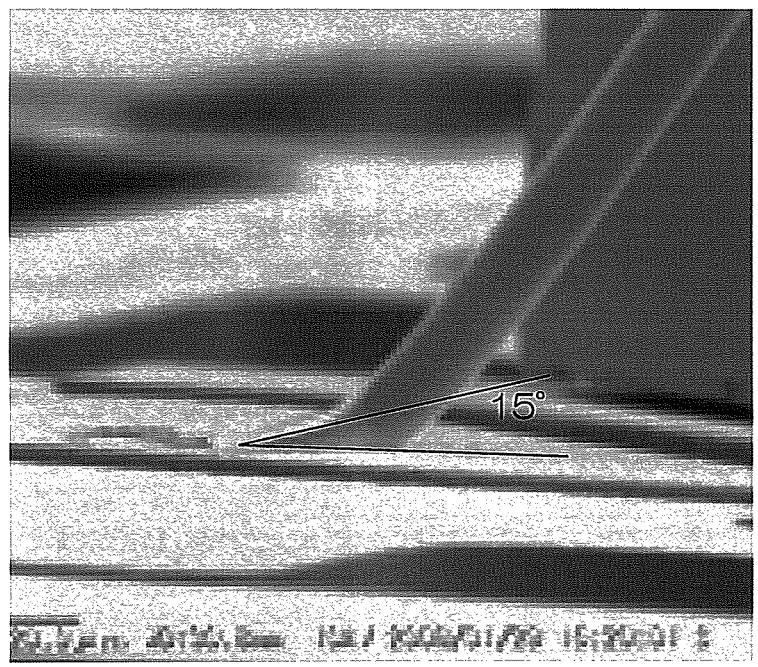
FIG. 24 is a SEM image (number one) in of a stitch portion obtained in Example 2.
Figure 25:
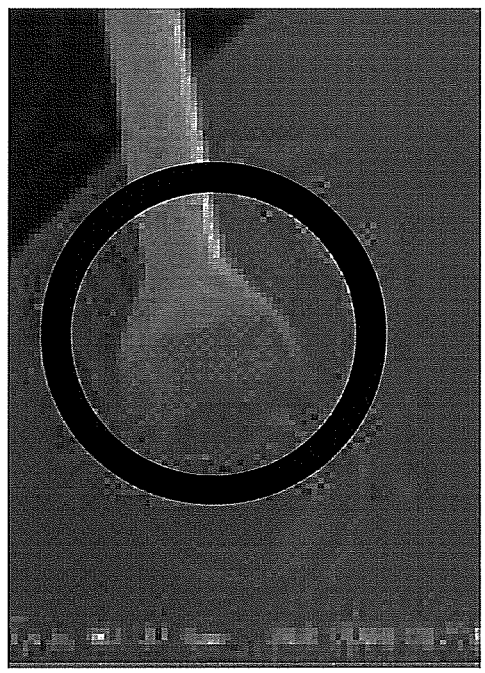
FIG. 25 is a SEM image (number two) in of the stitch portion obtained in Example 2.

Then, a portion (stitch portion) of the gold wire bonded to the lead was observed with a scanning electron microscope. FIGS. 24 and 25 show SEM images at that time.

As shown in FIGS. 24 and 25, it has been confirmed that such a stitch portion that an angle α formed by the upper surface thereof and the upper surface of the lead is 15° was formed and no defects such as cracks were formed in the vicinity of the stitch portion in Example 2.

3. Comparative Example

Figure 26:
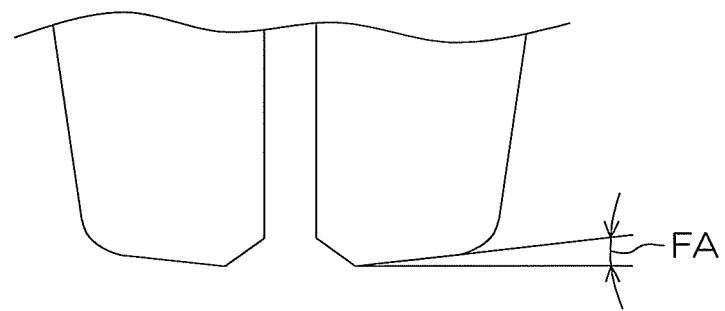
FIG. 26 is an illustrative sectional view showing a forward end shape of a capillary employed in comparative example.

A gold wire having a wire diameter of 25 µm was extended between a pad and a lead on a front surface of a semiconductor chip by normal bonding, by employing a capillary shown in FIG. 26. An FA (Face Angle) of the capillary shown in FIG. 26 is 11°. An angle of approach of the wire to the upper surface of the lead is 50°.

Figure 27:
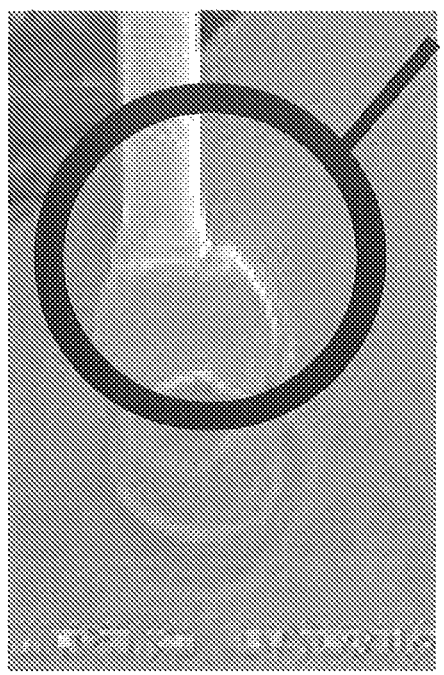
FIG. 27 is a SEM image in the vicinity of a stitch portion obtained in comparative example.

Then, a portion (stitch portion) of the gold wire bonded to the lead was observed with a scanning electron microscope. FIG. 27 shows a SEM image at that time.

As shown in FIG. 27, it has been confirmed that cracks were formed in the vicinity of the stitch portion in comparative example.

Third Embodiment

Figure 28:
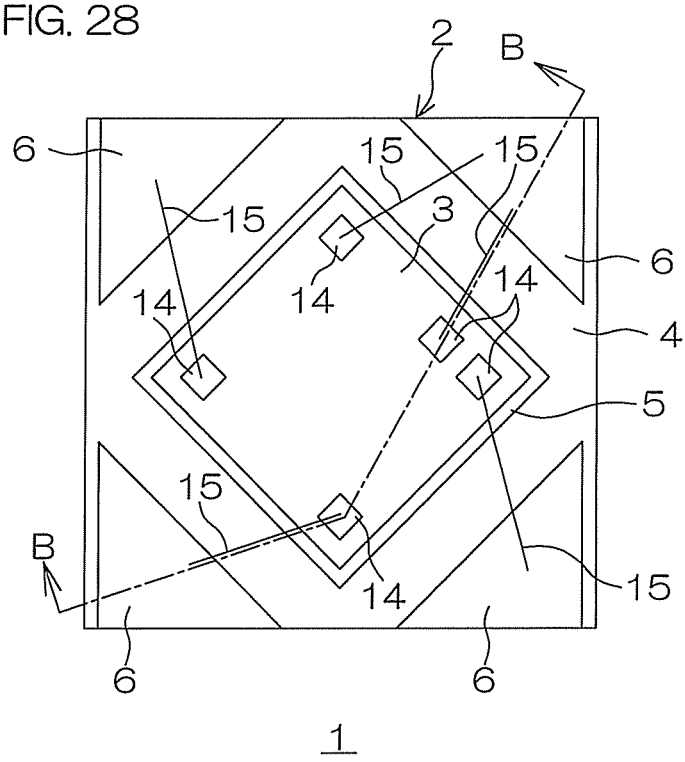
FIG. 28 is a schematic plan view of a semiconductor device according to a third embodiment of the present invention.
Figure 29:
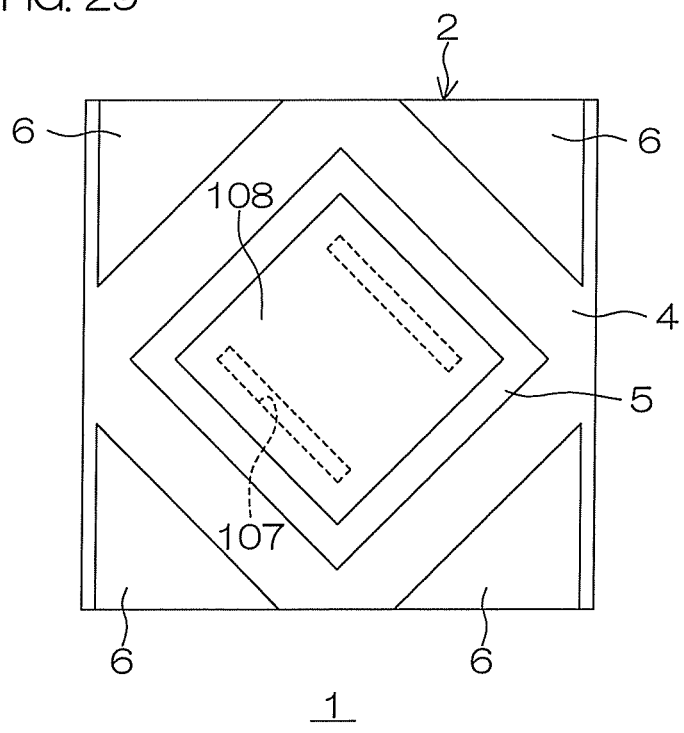
FIG. 29 is a schematic plan view showing a state of omitting a semiconductor chip, wires and a solder bonding agent from the semiconductor device shown in FIG. 28.
Figure 30:
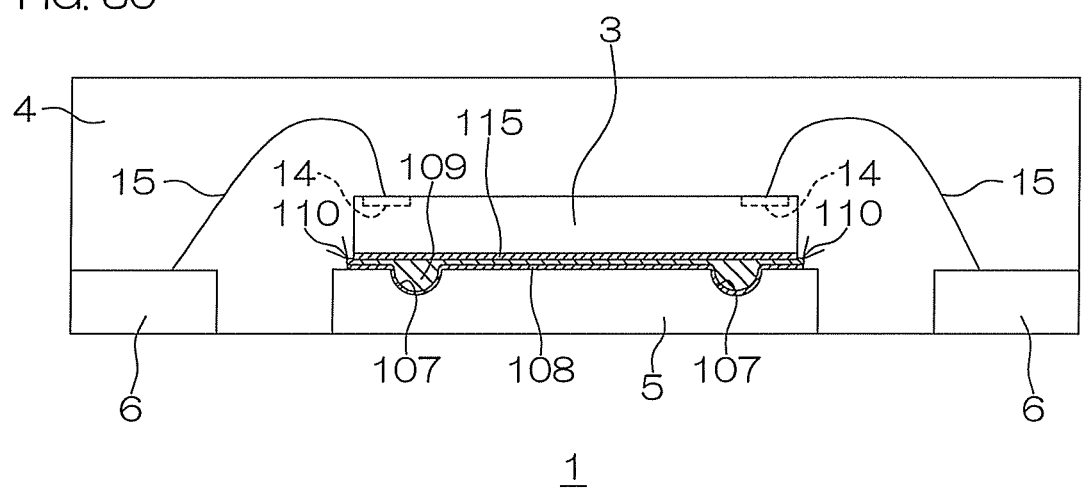
FIG. 30 is a schematic sectional view at a time of cutting the semiconductor device shown in FIG. 28 along a cutting plane line B-B.

FIG. 28 is a schematic plan view of a semiconductor device according to a third embodiment of the present invention. FIG. 29 is a schematic plan view showing a state of omitting a semiconductor chip, wires and a solder bonding agent from the semiconductor device shown in FIG. 28. FIG. 30 is a schematic sectional view at a time of cutting the semiconductor device shown in FIG. 28 along a cutting plane line B-B. In the description of this embodiment, it is assumed that portions corresponding to the respective portions in the first and second embodiments are denoted by the same reference numerals.

A semiconductor device 1 has a structure obtained by sealing a semiconductor chip 3 with a resin package 4 along with a lead frame 2. The outer shape of the semiconductor device 1 is in the form of a flat rectangular parallelepiped (hexahedron square in plan view in this embodiment).

The lead frame 2 is made of a metallic material such as copper (Cu), and includes an island 5 and four leads 6 arranged on the periphery of the island 5.

The island 5 is quadrangular in plan view (square in plan view in this embodiment). The lower surface of the island 5 is exposed on the rear surface of the resin package 4. The island 5 is provided with two (a pair of) trench-shaped recess portions 107 dug down from the upper surface thereof (see FIG. 29). The respective recess portions 107 are provided in the form of semicircles in section, and extend parallelly to two opposed sides of the island 5 respectively. On the upper surface of the island 5, a thin film 108 made of silver (Ag) is formed in a region including portions where the recess portions 107 are formed in plan view (see FIG. 29). More specifically, the thin film 108 is formed in a size generally identical to that of a portion of the island 5 opposed to the semiconductor chip 3 in a state where the semiconductor chip 3 is bonded onto the island 5, as shown in FIG. 28.

The leads 6 are arranged on portions opposed to four sides of the island 5 respectively in plan view. The respective leads 6 are provided in the form of triangles in plan view. The lower surfaces of the respective leads 6 are exposed on the rear surface of the resin package 4, and function as external terminals for connection with a wiring board (not shown).

As shown in FIG. 30, the rear surface of the semiconductor chip 3 is bonded (die-bonded) to the island 5 through a conductive solder bonding agent 109 in a state upwardly directing the front surface (device forming surface) of a side provided with functional elements. A metal film 115 for improving adhesiveness between the solder bonding agent 109 and the semiconductor chip 3 is applied to the rear surface of the semiconductor chip 3. The metal film 115 is a multilayer film formed by stacking Au (gold), Ni (nickel), Ag and Au in this order from the side of the semiconductor chip 3, for example.

A solidified flux 110 solidified in a resinous manner adheres to peripheral edge portions of the solder bonding agent 109, i.e., to side portions of bonded portions of the semiconductor chip 3 and the island 5.

On the front surface of the semiconductor chip 3, pads 14 are formed by exposing parts of a wiring layer from a surface protective film correspondingly to the respective leads 6. First ends of bonding wires 15 are bonded to the respective pads 14. Second ends of the bonding wires 15 are bonded to the upper surfaces of the respective leads 6. Thus, the semiconductor chip 3 is electrically connected with the leads 6 through the bonding wires 15.

The cutting plane line B-B extends parallelly to both of the wire 15 extending from the pad 14 on the lower end of the semiconductor chip 3 in FIG. 28 and the wire 15 extending from the pad 14 leftwardly adjacent to the pad 14 on the right end in FIG. 28. While the cutting plane line B-B overlaps with these wires 15 in practice, the same is illustrated on a position slightly deviating from these wires 15, in order to render these wires 15 easily observable.

FIGS. 31A to 31E are schematic sectional views for illustrating production steps for the semiconductor device shown in FIG. 28 in order. Referring to FIGS. 31A to 31E, illustration of the leads 6 and the bonding wires 15 etc. is omitted.

Figure 31A:
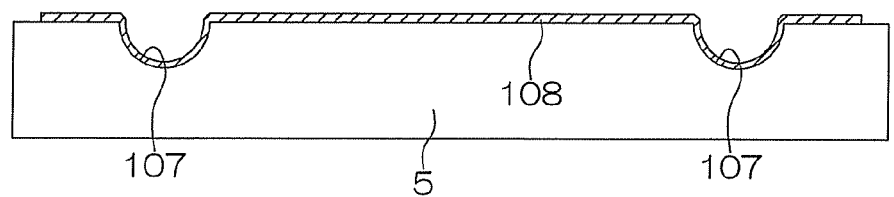
FIG. 31A is a schematic sectional view showing a production step for the semiconductor device shown in FIG. 28.

First, the lead frame 2 including the island 5 provided with the recess portions 107 is prepared. The lead frame 2 is formed by pressing and punching a copper thin plate, for example. Then, the thin film 108 made of silver is formed on the island 5 by plating or sputtering, as shown in FIG. 31A. At this time, the thin film 108 is formed also on the inner surfaces of the recess portions 107.

Figure 31B:
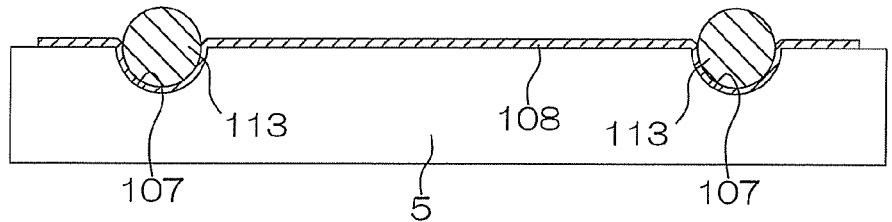
FIG. 31B is a schematic sectional view showing a step subsequent to FIG. 31A.

Then, support bodies 113 made of solid solder are arranged on the thin film 108 in the recess portions 107, as shown in FIG. 31B. The support bodies 113 are formed in shapes generally identical to those of the recess portions 107 in plan view, and have circular sections.

Figure 31C:
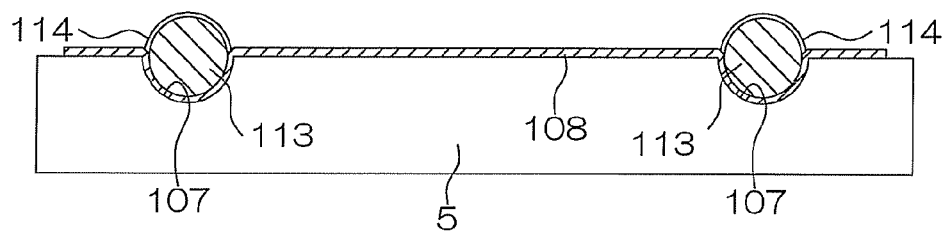
FIG. 31C is a schematic sectional view showing a step subsequent to FIG. 31B.

Thereafter a flux 114 is applied to the support bodies 113, as shown in FIG. 31C. The flux 114 may be collectively applied to the whole area of the upper surface of the island 5, or may be selectively applied to portions of the support bodies 113 exposed from the recess portions 107.

Figure 31D:
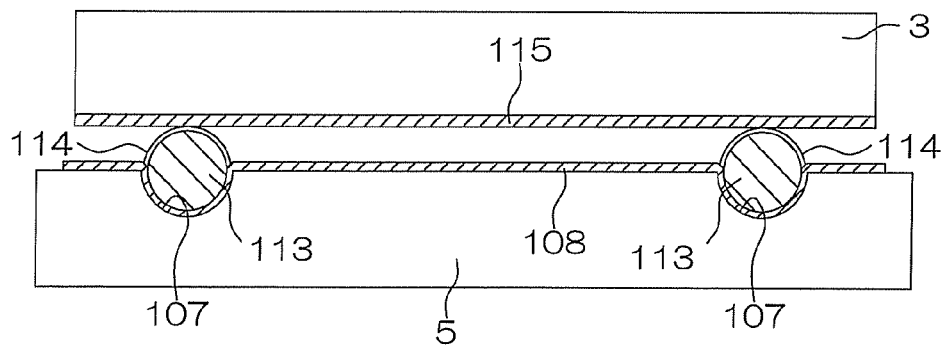
FIG. 31D is a schematic sectional view showing a step subsequent to FIG. 31C.

Then, the semiconductor chip 3 is placed on the support bodies 113, as shown in FIG. 31D. Thus, the semiconductor chip 3 is supported on the support bodies 113.

Figure 31E:
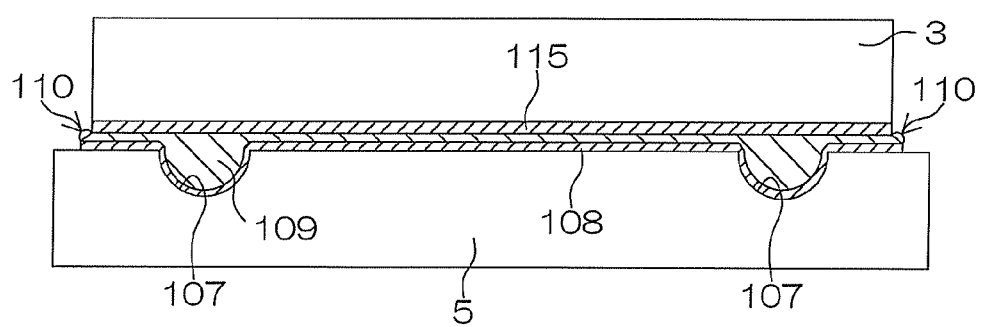
FIG. 31E is a schematic sectional view showing a step subsequent to FIG. 31D.

In a case where the support bodies 113 are lead solder, for example, a heat treatment for 30 sec. is performed under a temperature condition of 340° C., whereby the support bodies 113 are melted, and the support bodies 113 spread in the range where the thin film 108 is formed due to surface tension and wettability thereof, as shown in FIG. 31E. Thus, a clearance between opposed portions of the semiconductor chip 3 and the island 5 is filled up with the melted support bodies 113 (the solder bonding agent 109), and bonding between the semiconductor chip 3 and the island 5 is achieved. At this time, the flux 114 aggregates and is solidified on the side portions of the semiconductor chip 3 while washing the lower surface of the semiconductor chip 3 (the front surface of the metal film 115) and the upper surface of the island 5, to become the solidified flux 110.

Thereafter the bonding wires 15 are extended between the semiconductor chip 3 and the leads 6, and the resin package 4 is formed so that only the rear surfaces of the island 5 and the leads 6 are exposed, whereby the semiconductor device 1 shown in FIGS. 28 to 30 is obtained.

As hereinabove described, melted solder spreads between the semiconductor chip 3 and the island 5 in the heat treatment, due to the surface tension and the wettability possessed by the solder. Therefore, no load may be applied to the semiconductor chip 3 in the bonding of the semiconductor chip 3 to the island 5, dissimilarly to a method employing a pasty adhesive for the bonding between the semiconductor chip 3 and the island 5. No load is applied to the semiconductor chip 3, whereby spreading of the solder by the load can be prevented. Further, the semiconductor chip 3 and the island 5 can be bonded to each other without causing remarkable protrusion of the solder from a space between the semiconductor chip 3 and the island 5 by varying the magnitude, the shape and the number of the support bodies 113 in response to the size of the semiconductor chip 3, regardless of the size of the semiconductor chip 3. Even in a small-sized semiconductor chip 3, therefore, die bonding to the island 5 can be achieved without causing various problems resulting from spreading of the solder.

The support bodies 113 are arranged on the thin film 108 made of silver. The wettability of the solder with respect to the silver is so high that, when the support bodies 113 are melted in the heat treatment, the melted support bodies 113 spread in the range where the thin film 108 made of silver is formed. Therefore, spreading of the support bodies 113 can be controlled and occurrence of various problems resulting from spreading of the solder can be reliably prevented by forming the thin film 108 made of silver.

Further, the island 5 is provided with the recess portions 107 dug down from the upper surface thereof, and the support bodies 113 are arranged in the recess portions 107. Thus, the support bodies 113 can be stably arranged on the island 5.

In addition, the flux 114 is applied to the support bodies 113, whereby the front surfaces of the support bodies 113 can be prevented from oxidation, and the wettability of the support bodies 113 (solder) in the heat treatment can be improved. Further, portions of the semiconductor chip 3 and the island 5 in contact with the flux 114 are washed due to action of the flux 114, whereby the adhesiveness between the semiconductor chip 3 and the island 5 can be further improved.

Figure 32:
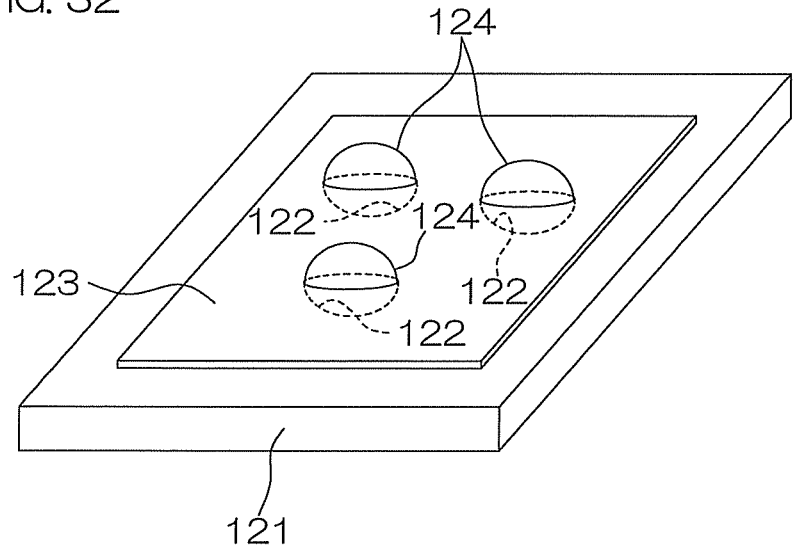
FIG. 32 is a perspective view showing another structure of an island and support bodies.

FIG. 32 is a perspective view showing another structure of the island and the support bodies.

An island 121 shown in FIG. 32 can be employed in place of the island 5 shown in FIG. 28.

The island 121 is quadrangular in plan view. The island 121 is provided with three recess portions 122 semispherically dug down from the upper surface thereof. The respective recess portions 122 are arranged at intervals from one another so that the inside of lines connecting the same with one another is in the form of a triangle.

On the upper surface of the island 121, a thin film 123 made of silver is formed in a region including portions where the recess portions 122 are formed in plan view. More specifically, the thin film 123 is formed in a size generally identical to that of a portion of the island 121 opposed to the semiconductor chip 3 in a state where the semiconductor chip 3 (see FIG. 28) is bonded onto the island 121. The thin film 123 is formed also on the inner surfaces of the respective recess portions 122.

Support bodies 124 are arranged on the thin film 123 in the recess portions 122. The support bodies 124 are provided in the form of spheres having a diameter generally identical to that of the recess portions 122.

When the semiconductor chip 3 is placed on the three support bodies 124 and a heat treatment is performed, the support bodies 124 are melted, and the support bodies 124 (solder) spread in the range where the thin film 123 is formed due to surface tension and wettability thereof. Thus, a clearance between opposed portions of the semiconductor chip 3 and the island 121 is filled up with the melted support bodies 124, and bonding between the semiconductor chip 3 and the island 121 is achieved.

Figure 33:
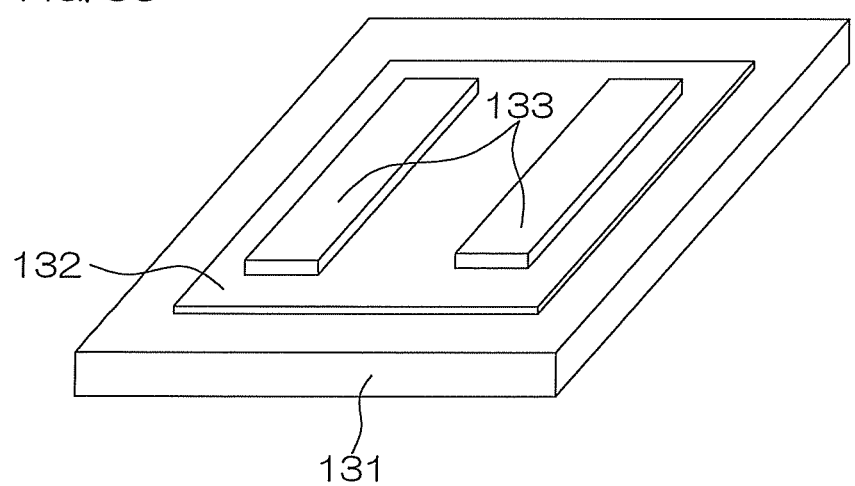
FIG. 33 is a perspective view showing still another structure of the island and the support bodies.

FIG. 33 is a perspective view showing still another structure of the island and the support bodies.

An island 131 shown in FIG. 33 can be employed in place of the island 5 shown in FIG. 28.

The island 131 is quadrangular in plan view. A thin film 132 made of silver is formed on the upper surface of the island 131. More specifically, the thin film 132 is formed in a size generally identical to a portion of the island 131 opposed to the semiconductor chip 3 in a state where the semiconductor chip 3 (see FIG. 28) is bonded onto the island 131.

Two support bodies 133 are arranged on the thin film 132. The support bodies 133 are provided in the form of slender plates (in the form of ribbons) in plan view, and parallelly extend at an interval from each other.

When the semiconductor chip 3 is placed on the two support bodies 133 and a heat treatment is performed, the support bodies 133 are melted, and the support bodies 133 (solder) spread in the range where the thin film 132 is formed due to surface tension and wettability thereof. Thus, a clearance between opposed portions of the semiconductor chip 3 and the island 131 is filled up with the melted support bodies 133, and bonding between the semiconductor chip 3 and the island 131 is achieved.

While the so-called surface-mounted semiconductor device in which rear surfaces of leads and an island are exposed from a rear surface of a resin package has been illustrated as the semiconductor device 1, this embodiment may be applied to a resin-sealed semiconductor device in which leads extend toward side portions of a resin package. In other words, this embodiment can be widely applied to a semiconductor device having a structure obtained by bonding a semiconductor chip onto an island.

While the present invention has been described in detail byway of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2009-210776 filed with the Japan Patent Office on Sep. 11, 2009 and Japanese Patent Application No. 2009-214925 filed with the Japan Patent Office on Sep. 16, 2009, the disclosures of which are incorporated herein by reference.

DESCRIPTION OF THE REFERENCE NUMERALS 1 semiconductor device
3 semiconductor chip
5 island
6 lead 14 pad
15 wire
16 ball portion
17 stitch portion
107 recess portion
108 thin film
109 solder bonging agent
110 solidified flux (flux)
113 support body
114 flux
121 island
122 recess portion
123 thin film
124 support body
131 island
132 thin film
133 support body

The invention claimed is:

1. A semiconductor device comprising:
a semiconductor chip;
leads arranged on a side portion of the semiconductor chip;
a wire, whose one end and another end are bonded to the semiconductor chip and the leads respectively, having a ball portion and a stitch portion wedged in a side elevational view on the semiconductor chip and the leads respectively;
an island having an upper surface that the semiconductor chip is bonded to;
a solder bonding agent made of solder and interposed between the semiconductor chip and the island for bonding the semiconductor chip and the island to each other;
a flux adhering to the solder bonding agent; and
a package covering a part of the island and the leads, wherein
an angle of approach of the wire to the leads is not less than 50°,
a length of the stitch portion is not less than 33 µm,
the length of the stitch portion is a distance from a first edge of the stitch portion, corresponding to an outline of an opening of a capillary of a wire bonder, to a second edge of the stitch portion which is located opposite the first edge,
the island has a quadrangular shape having four sides inclined by 45° with respect to respective sides of the package in a plan view,
the island includes hanging portions extending from respective corner portions of the island toward a center of the respective sides of the package in the plan view, and
each respective lead of the leads is arranged at a respective one of four corners of the package and has a side opposed to a nearest one of the four sides of the island which is nearest to the respective lead, in the plan view.

2. The semiconductor device according to claim 1, which is a surface-mounted type, wherein the package includes a sealing resin sealing the semiconductor chip, the leads and the wire.

3. The semiconductor device according to claim 2, which is a non-leaded type, wherein the leads flees do not protrude from the sealing resin.

4. The semiconductor device according to claim 1, wherein the island is provided with a recess portion dug down from the upper surface thereof.

5. The semiconductor device according to claim 4, wherein the recess portion is semicircular in a section thereof.

6. The semiconductor device according to claim 4, wherein the recess portion is semispherical.

7. The semiconductor device according to claim 1, wherein a pair of trench-shaped recess portions dug down to extend along two opposed sides of the quadrangular island respectively are formed on the upper surface of the island.

8. A semiconductor device according to claim 1, wherein each respective lead of the leads has the side thereof, that is opposed to the nearest side of the island, disposed so as to be parallel to the nearest side in the plan view.

9. A semiconductor device comprising:
a semiconductor chip;
leads arranged on a side portion of the semiconductor chip;
a wire, whose one end and another end are bonded to the semiconductor chip and the leads respectively, having a ball portion and a stitch portion wedged in a side elevational view on the semiconductor chip and the leads respectively;
an island having an upper surface that the semiconductor chip is bonded to;
a solder bonding agent made of solder and interposed between the semiconductor chip and the island for bonding the semiconductor chip and the island to each other;
a flux adhering to the solder bonding agent; and
a package covering a part of the island and the leads, wherein
an angle of approach of the wire to the leads is not less than 50°,
an angle formed by an upper surface of the stitch portion and an upper surface of the leads is not less than 15°,
a length of the stitch portion is not less than 33 µm,
the length of the stitch portion is a distance from a first edge of the stitch portion, corresponding to an outline of an opening of a capillary of a wire bonder, to a second edge of the stitch portion which is located opposite the first edge,
the island has a quadrangular shape having four sides inclined by 45° with respect to respective sides of the package in a plan view,
the island includes hanging portions extending from respective corner portions of the island toward a center of the respective sides of the package in the plan view, and
each respective lead of the leads is arranged at a respective one of four corners of the package and has a side opposed to a nearest one of the four sides of the island which is nearest to the respective lead, in the plan view.

10. The semiconductor device according to claim 9, which is a surface-mounted type, wherein the package includes a sealing resin sealing the semiconductor chip, the leads and the wire.

11. The semiconductor device according to claim 10, which is a non-leaded type, wherein the leads do flees not protrude from the sealing resin.

12. A semiconductor device comprising:
a semiconductor chip;
leads arranged on a side portion of the semiconductor chip;
a wire, whose one end and another end are bonded to the semiconductor chip and the leads respectively, having a ball portion and a stitch portion wedged in a side elevational view on the semiconductor chip and the leads respectively;
an island having an upper surface that the semiconductor chip is bonded to;

a solder bonding agent made of solder and interposed between the semiconductor chip and the island for bonding the semiconductor chip and the island to each other;
a flux adhering to the solder bonding agent; and
a package covering a part of the island and the leads, wherein
a length of the wire is not more than 400 μm,
a difference in elevation between a portion of the semiconductor chip to which the ball portion is bonded and a portion of the leads to which the stitch portion is bonded is not less than 200 μm,
a length of the stitch portion is not less than 33 μm,
the length of the stitch portion is a distance from a first edge of the stitch portion, corresponding to an outline of an opening of a capillary of a wire bonder, to a second edge of the stitch portion which is located opposite the first edge,
the island has a quadrangular shape having four sides inclined by 45° with respect to respective sides of the package in a plan view,
the island includes hanging portions extending from respective corner portions of the island toward a center of the respective sides of the package in the plan view, and
each respective lead of the leads is arranged at a respective one of four corners of the package and has a side opposed to a nearest one of the four sides of the island which is nearest to the respective lead, in the plan view.

13. The semiconductor device according to claim 12, which is a surface-mounted type, wherein the package includes a sealing resin sealing the semiconductor chip, the leads and the wire.

14. The semiconductor device according to claim 13, which is a non-leaded type, wherein the leads do flees not protrude from the sealing resin.

15. A semiconductor device comprising:
a semiconductor chip;
leads arranged on a side portion of the semiconductor chip;
a wire, whose one end and another end are bonded to the semiconductor chip and the leads respectively, having a ball portion and a stitch portion wedged in a side elevational view on the semiconductor chip and the leads respectively;
an island having an upper surface that the semiconductor chip is bonded to;
a solder bonding agent made of solder and interposed between the semiconductor chip and the island for bonding the semiconductor chip and the island to each other;
a flux adhering to the solder bonding agent; and
a package covering a part of the island and the leads, wherein
a length of the wire is not more than 400 μm,
a difference in elevation between a portion of the semiconductor chip to which the ball portion is bonded and a portion of the leads to which the stitch portion is bonded is not less than 200 μm,
an angle formed by an upper surface of the stitch portion and an upper surface of the leads is not less than 15°,
a length of the stitch portion is not less than 33 μm,
the length of the stitch portion is a distance from a first edge of the stitch portion, corresponding to an outline of an opening of a capillary of a wire bonder, to a second edge of the stitch portion which is located opposite the first edge,
the island has a quadrangular shape having four sides inclined by 45° with respect to respective sides of the package in a plan view,
the island includes hanging portions extending from respective corner portions of the island toward a center of the respective sides of the package in the plan view, and
each respective lead of the leads is arranged at a respective one of four corners of the package and has a side opposed to a nearest one of the four sides of the island which is nearest to the respective lead, in the plan view.

16. The semiconductor device according to claim 15, which is a surface-mounted type, wherein the package includes a sealing resin sealing the semiconductor chip, the leads and the wire.

17. The semiconductor device according to claim 16, which is a non-leaded type, wherein the leads do not protrude from the sealing resin.

18. A semiconductor device comprising:
a semiconductor chip;
leads arranged near the semiconductor chip;
a wire bonded to the semiconductor chip and the leads, the wire having a ball portion and a stitch portion wedged in a side elevational view on the semiconductor chip and the leads respectively;
an island that the semiconductor chip is bonded to;
a solder bonding agent made of solder and interposed between the semiconductor chip and the island for bonding the semiconductor chip and the island to each other;
a flux adhering to the solder bonding agent; and
a package covering a part of the island and the leads,
wherein in a plan view, the island has a quadrangular shape having four sides that are each skewed relative to each outer side of the package,
the island includes hanging portions extending from respective corner portions of the island toward a center of the respective outer sides of the package in the plan view, and
each respective lead of the leads is arranged at a respective one of four corners of the package and has a side opposed to a nearest one of the four sides of the island which is nearest to the respective lead, in the plan view.

* * * * *